(12) United States Patent
Lübker et al.

(10) Patent No.: US 11,905,928 B2
(45) Date of Patent: Feb. 20, 2024

(54) METHOD OF AND SYSTEM FOR MONITORING AND DIAGNOSING A GROUNDING SYSTEM

(71) Applicant: VENTUS ENGINEERING GMBH, Vienna (AT)

(72) Inventors: Poul Anker Skaarup Lübker, Baar (CH); Shavkat Mingaliev, Vienna (AT); Hassan Iqbal, Schwechat (AT); Daniel Peto, Halaszi (HU); Unnikrishnan Raveendran Nair, Vienna (AT)

(73) Assignee: Ventus Engineering GmbH, Vienna (AT)

( * ) Notice: Subject to any disclaimer, the term of this patent is extended or adjusted under 35 U.S.C. 154(b) by 0 days.

(21) Appl. No.: 18/060,720

(22) Filed: Dec. 1, 2022

(65) Prior Publication Data
US 2023/0108003 A1   Apr. 6, 2023

Related U.S. Application Data

(63) Continuation-in-part of application No. 17/928,187, filed as application No. PCT/EP2021/054906 on Feb. 26, 2021.

(30) Foreign Application Priority Data

May 28, 2020   (EP) .................................... 20177096

(51) Int. Cl.
| | | |
|---|---|---|
| *F03D 17/00* | (2016.01) | |
| *F03D 80/30* | (2016.01) | |
| *G01R 29/12* | (2006.01) | |
| *G08B 21/18* | (2006.01) | |
| *G01W 1/10* | (2006.01) | |
| *G01R 31/52* | (2020.01) | |
| *F03D 7/02* | (2006.01) | |

(52) U.S. Cl.
CPC ............ *F03D 17/00* (2016.05); *F03D 7/0224* (2013.01); *G01R 31/52* (2020.01); *G01W 1/10* (2013.01); *G08B 21/18* (2013.01)

(58) Field of Classification Search
CPC .......... F03D 17/00; F03D 80/30; G01R 29/12
See application file for complete search history.

(56) References Cited

U.S. PATENT DOCUMENTS

| | | | | |
|---|---|---|---|---|
| 2012/0162845 | A1* | 6/2012 | Sanchez | F03D 80/30 361/131 |
| 2018/0057176 | A1* | 3/2018 | Kinlen | B64C 27/46 |
| 2022/0397098 | A1* | 12/2022 | Klümper | F03D 80/60 |

\* cited by examiner

*Primary Examiner* — Long T Tran
(74) *Attorney, Agent, or Firm* — McDonnell Boehnen Hulbert & Berghoff LLP

(57) ABSTRACT

Examples include a structure adapted for monitoring electric charge characteristics of the structure, where the wind turbine generator includes an electric charge monitoring system including one or more electrostatic sensors adapted for measuring polarity, the one or more electrostatic sensors being configured for measuring an electrostatic potential of one or more parts or at locations of the structure, where sensory data from the electrostatic sensors are time-stamped and time-synchronised, and the electric charge monitoring system is configured for monitoring charge characteristics at the one or more parts or locations of the structure.

22 Claims, 17 Drawing Sheets

A:

B:

C:

METHOD OF AND SYSTEM FOR MONITORING AND DIAGNOSING A GROUNDING SYSTEM

CROSS REFERENCE TO RELATED APPLICATIONS

The present application is a continuation-in-part of U.S. application Ser. No. 17/928,187, filed Nov. 28, 2022, which is a § 371 national stage of international application no. PCT/EP2021/054906, filed Feb. 26, 2021, which claims priority to European application no. 20177096.3, filed May 28, 2020, the contents of all of which are hereby incorporated by reference.

FIELD OF THE DISCLOSURE

Disclosed is a system and a method of diagnosing a grounding system of a structure comprising a charge collecting structure conductively connected to the ground via a grounding path, wherein diagnosing involves an act of monitoring an output of an electrostatic motor connected to the grounding path. Further disclosed is that this system can use the framework of any erected structure along with the electrostatic motor and an energy storage system as an ambient static charge energy harvester. Finally, disclosed is a system and method of diagnosing a grounding system by means of voltage and/or current and/or electrostatic detectors in combination with the electrostatic motor or alone.

BACKGROUND

Structures erected or operated under ambient conditions often experience electrical charges and electrostatic fields. Structural elements collect electrostatic charge. In example towers, tall buildings, bridges, spheres (like Horton spheres) used for storing compressed combustible gases, street lights, etc. may be such structures, objects which can produce—not only collect—electrostatic energy constantly, partially, periodically.

Such structures are subjected to harsh weather conditions, including lightning. Technical means, systems, and methods exist to mitigate the effect of lightning for example on a wind turbine generator. Grounding or earthing arrangements of different types exist to protect such structures from damage and will increase their lifetime.

However, unintentional fully or partly disconnection of the grounding system, wear and tear, lightning, and general discharging alter the grounding systems and grounding systems must receive periodic inspection and maintenance throughout the life to retain its effectiveness. There is a need for monitoring, diagnosing and providing information about the actual conditions or workings of grounding or earthing systems.

The electrostatic energy associated with the induced charge on the erected structures represents an ambient energy source. For example, lightning strikes can provide power in the range of GW. Conventional grounding systems transfer this induced static charge to earth, resulting in the energy associated with static charge not being utilised at all. The ability to harvest and store, at least a small percentage of this ambient energy, otherwise dissipated through the grounding systems, will provide manageable energy reserves. The erected structures use a wide array of sensors as part of monitoring systems, including the grounding monitoring system.

An exemplary structure may be a wind turbine generator.

Lightning is an electrical discharge within clouds, from cloud to cloud, or from cloud to the earth. It is known in the industry that the most significant danger facing wind turbines is damage from lightning strikes. A German study found that 80% of wind turbine insurance claims paying out for damage compensation were caused by lightning strikes. 85% of the downtime experienced by one commercial wind farm in the USA was found to be related to lightning strikes, costing around USD250,000 in the first year of operation alone. And as another example, a large wind farm in the North Sea, near the German island of Helgoland, suffered losses because of lightning strikes so large that its operation was no longer cost effective. Lightning faults cause more loss in wind turbine availability and production than the average fault. The number of failures due to lightning strikes is known to increase with tower height and a growing number of studies speculate that rotating wind turbines may be more susceptible to lightning strikes than stationary structures. Given that turbine heights are expected to increase, and the renewable energy industry is growing, the number of failures is likely to grow with them.

To reduce the likelihood of lightning damage, lightning protection systems are built into the wind turbine structures to safeguard against damage or injury caused by lightning or by currents induced in the earth from lightning.

The major purpose of built-in grounding systems is to conduct the high current lightning discharges safely into the earth. A well-designed grounding system will minimize voltage differences between areas of a structure and offer protection against damage.

These built in grounding systems offer protection against both direct and indirect effects of lightning. The direct effects are burning, blasting, fires and electrocution. The indirect effects are deficient operation of control or other electronic equipment due to electrical transients.

The grounding system takes the form of a low resistance path to ground. The path goes from the blade's tip to the base of the turbine. In the event of a lightning strike, current will flow to ground through the lightning protection system, not the sensitive equipment in the wind turbine. To ensure that the protection will work when needed, the resistance of the path to ground is checked and measured at regular intervals, making sure it meets the limits specified by the turbine manufacturer (typically limited to 15-30 mΩ, depending on turbine size).

However, the blades flexes with the wind and are under strain etc., and therefore wear and tear, lightning, general discharging and intentional or unintentional fully or partly disconnection of the grounding system alter the grounding systems. The industry practice today is that grounding systems therefore receive periodic inspection and maintenance throughout its lifespan to retain its effectiveness. Since the periodic inspection clearly is not sufficient to secure a permanent efficient grounding or earthing system, it will be advantageous to monitor, diagnose and provide information about the actual conditions or workings of grounding or earthing systems.

Known art comprises some relevant disclosures including the following, where IOP Publishing under Smart Materials and Structures 24 (2015) 033001 presents a topical review of "A review of damage detection method for wind turbine blades" by Dongsheng Li et al. Furthermore, more detailed aspects are disclosed in e.g. the patent literature, where GB2463818A discloses a device detecting lightning currents in a wind turbine, JP2017020423A discloses an external lightning protection system for wind turbine blades, and US2013336786A1 discloses aspects of a system and method for automatically inspecting a lighting protection system on a wind turbine generator.

SUMMARY

It is an objective to improve monitoring the discharging of electrostatic electricity and events, such as lightning strikes and the efficiency of the grounding system, and provide relevant information when there is a need for inspection or improved correct grounding or earthing of erected structures, including those of wind turbine generators.

A structure adapted for monitoring electric charge characteristics of the structure, wherein the wind turbine generator comprises an electric charge monitoring system comprising one or more electrostatic sensors adapted for measuring polarity, the one or more electrostatic sensors being configured for measuring an electrostatic potential of one or more parts or at locations of the structure, wherein sensory data from the electrostatic sensors are time-stamped and time-synchronised, and the electric charge monitoring system is configured for monitoring charge characteristics at the one or more parts or locations of the structure.

The electric charge monitoring system may further comprise a processor for analysing the sensory data, a computer-readable storage for storing one or more computer programs and the sensory data from the electrostatic sensors. The electric charge monitoring system may further comprise a communication module for communicating with an external server and optionally sending sensory data to the external server, thereby enabling the sensory data to be stored on the external server.

The one or more electrostatic sensors are configured to measure both measure positive charge generation and negative charge generation as this will enable the structure to predict rain as shown in FIGS. 12-17. The FIGS. 12-17 show data from a weather station at Gols (47.898-degrees north, 16.909-degrees east) and sensory data from a structure being a wind turbine generator with the electric charge monitoring system. Over the course of a month, there was a correlation between a reverse polarity i.e., negative electric field measured at the electrostatic sensors and following this reverse polarity rain is observed in seven out of eight cases over the course of a month.

In an embodiment, the electric charge monitoring system is further configured for predicting rain as a function of the sensory data and optionally sending an alert as a function of predicted rain. The processor may analyse the sensory data and when a reverse polarity is observed then send the alert of predicted rain. If the structure is a wind turbine generator, then this information is very important as rain will wear wind turbine blades but some types of rain, known as heavy rain, or hail can damage wind turbine blades within 15 minutes so severely that the blades require extensive and expensive repairing. In Denmark, and probably in Gols, Austria, there is only heavy rain 15-30 minutes annually, however in other part of the world there may be heavy rain for several hours annually. The damage can be prevented by either stopping the wind turbine generator or reducing the revolutions of the wind turbine generator. This will reduce the annually power generation by a very low margin but reduce maintenance costs significantly. The alert may be sent to an operator which may then decide whether or not to pre-emptively stop the wind turbine generator, or to reduce rotation speed of the wind turbine generator, or to observe the area around the wind turbine generator using various data sources.

The alert may also cause a control system of the wind turbine generator to increase the sampling rate of other sensors such as but not limited to accelerometers as accelerometers installed in blades can be used for detecting heavy rain, however other sensors may also be used for detecting rain. The increase in sampling rate will make the sensors more sensitive allowing for faster detection. In theory many of these accelerometers or other sensors could run at a higher sampling frequency constantly however that would also increase needed computation power and computer storage. This is unwanted as the sensors will in general measure long periods where nothing important happens and where the lower sampling frequency is sufficient.

In an embodiment, one or more of the one or more electrostatic sensors are chosen amongst
 a surface potential sensor; and/or
 a non-contact vibration capacitance electrostatic sensor.

Both the surface potential sensor and the non-contact vibration capacitance electrostatic sensor are well-known sensors within the printing industry and thus these types of sensors are reliable and can be used for measuring the surface charge at various different positions along the structures.

In an embodiment, the structure is chosen amongst;
 a wind turbine generator (WTG) comprising one or more wind turbine blades; or
 a pylon; or
 a high-rise building; or
 a bridge; or
 a dam.

In most cases all these structures are of a size which will cause them to sway or oscillate relative to a foundation and this movement will generate a charge. However, the wind turbine generator differs as the one or more wind turbine blades move at considerable higher speeds. In some embodiments, a tip of blade moves at a speed above 300 km/h and this value is expected to increase as rotor diameters are increasing.

Thus, the charge generation from a wind turbine generator is considerable higher than any of the other structures due to the blades rotating. Since the wind turbine blades rotate in a great area with a revolution per minute between 10-30, then the wind turbine blades will in effect perform a measurement of the near atmosphere and changes to the atmosphere, which happens before rain, can therefore be observed by the wind turbine generator.

In an embodiment, the structure is a wind turbine generator comprising one or more wind turbine blades, wherein at least two of the wind turbine blades comprises one or more of the electrostatic sensors and the electric charge monitoring system is configured for comparing charge characteristics of the two or more wind turbine blades. The at least two wind turbine blades are moving through the same atmosphere thus if the wind turbine blades are identical and have the same blade pitch angle then no difference in charge generation should be observed. However, charge generation will increase as a function of surface roughness thus a difference charge generation may be due to uneven wear of the blades. Charge generation is also expected to change as a function of the blade pitch angle thus if two blades have different blade pitch angles then the force interaction between the wind and each blade will not be the same; the charge generation will be greatest for the blade with the strongest force interaction, and this will enable the system to calculate which blade is the driving blade of the at least two blades. This may further indicate there is blade pitch misalignment.

In an embodiment, the structure is a wind turbine generator wherein the structure is a wind turbine generator (WTG) comprising one or more wind turbine blades, wherein at least one of the wind turbine blades comprises one or more of the electrostatic sensors and the electric charge monitoring system is configured to estimate leading edge erosion on the one or more wind turbine blades as a function of charge characteristics and comparing sensory data of the at least one electrostatic sensor with historical sensory data. Thereby a blade wear rate can be estimated, and it can be decided when it is required to repair the blade. Furthermore, sudden changes to the blade surface due to a severe damage will be observable by a sudden displacement of the measured values.

In an embodiment, the structure is a wind turbine generator wherein the structure is a wind turbine generator (WTG) comprising one or more wind turbine blades, wherein at least one of the wind turbine blades comprises one or more of the electrostatic sensors and the electric charge monitoring system is configured to predict rain, or hail, or heavy rain, or sandstorms, or snow, as a function of the charge characteristics of the wind turbine generator.

In an embodiment, the structure is a wind turbine generator wherein the structure is a wind turbine generator (WTG) comprising one or more wind turbine blades, wherein at least one of the wind turbine blades comprises one or more of the electrostatic sensors and the electric charge monitoring system is configured to detect icing on the one or more wind turbine blades as a function of charge characteristics by comparing sensory data of the at least one electrostatic sensor with historical sensory data. The icing will change the surface of the blade and as a consequence the charge generation of the blade will change over time, which can be observed by comparing with historical sensory data.

The wind turbine generator further comprises a temperature sensor and/or humidity sensor and/or an air pressure sensor and/or a wind speed sensor, and the monitoring of charge characteristics is performed as a function of the temperature and/or the humidity and/or pressure and/or wind speed. The additional data will further improve the diagnosing of the wind turbine generator.

The wind turbine generator may comprise a grounding system. The grounding system comprising a charge collecting structure conductively connected to the ground via a grounding path, wherein the electric charge monitoring system is further configured for diagnosing the grounding system as a function of the electrostatic potential at the one or more parts or locations of the structure. The grounding path is a predesigned path for electric discharge such that generated charge from the wind turbine blades or other parts of the wind turbine generator does not damage or wear equipment sensitive to an uncontrolled discharge or uncontrolled current flow. The electrostatic sensors are positioned along the grounding path and along or close to sensitive equipment, the grounding system can then be monitored by comparing sensory data from the electrostatic sensors.

The electric charge monitoring system may further be configured for monitoring risk of a lightning strike. The bottom of a lightning cloud is negative and will cause a displacement of electrons causing a structure such as a wind turbine generator to become positive, which will be observed by the electrostatic sensors. Thus, by continuously monitoring it is possible to estimate and in some cases predict lightning.

The electric charge monitoring system is further configured to characterise lightning strikes as a function of the electrostatic potential of the one or more parts of the structure or at various locations of the structure before, during, and after a lightning strike. Thereby, it is possible to estimate a severity level of the lightning as a function of the sensory data.

The one or more electrostatic sensors include electrostatic sensors positioned external to the structure for measuring electrostatic potential of the structure.

The structure is a wind turbine generator comprising one or more wind turbine blades, and wherein the electric charge monitoring system is enabled to control the blade pitch angle of the one or more wind turbine blades, and the electric charge monitoring system is adapted to optimize the aero dynamic efficiency by changing blade pitch angle.

The electric charge monitoring system comprises a communication module for communication with an external server, the external server may further include a computer-readable medium for storing all or at least part of the sensory data. The external server may include a server processor for diagnosing and/or analysing the sensory data.

An embodiment is a fleet monitoring server comprising
a server communication module being in communication with a plurality of structures,
a storage for storing sensory data from the sensors of the plurality of structures;
a computation unit configured for comparing sensory data from the plurality of structures and identifying one or more outliers of the structure as a function of the sensory data.

The storage may be further configured for storing humidity levels, temperature, wake, wind speed and/or pressure.

The fleet monitoring server is configured for sending alarms as a function of outliers. The structures may be wind turbine generators and some of these wind turbine generators may be statistically outliers and as such these wind turbine generators should be investigated further as this may be due to blade damage or icing or other factors which may result in the wind turbine generators being outliers.

A method of monitoring charge characteristics of a wind turbine generator comprising one or more wind turbine blades with one or more electrostatic sensors having a voltage detection range including positive potential and/or negative potential, the method comprising steps of
measuring sensory data of the one or more electrostatic sensors;
timestamping and time-synchronising the sensory data;
storing the sensory data;
monitoring charge characteristics of the wind turbine generator;
sending an alarm as a function of the charge characteristics.

The method includes a step of detecting a lightning strike and/or electrostatic discharge.

The one or more wind turbine blades comprises one or more of the electrostatic sensors, wherein the method comprises a step of
estimating a surface roughness of the one or more wind turbine blades as a function of the charge generation.

The step of monitoring includes a step of predicting rain and/or hail as a function of measured polarity at the one or more electrostatic sensors.

An object is achieved by a method of diagnosing a grounding system of a structure comprising a charge collecting structure conductively connected to the ground via a grounding path, wherein diagnosing involves an act of monitoring an output of an electrostatic motor connected to the grounding path.

As will be disclosed, diagnosing or monitoring of the efficiency of the grounding system of a structure may be performed by means of monitoring the efficiency of an electrostatic motor. This may be done in combination with a generator driven by the torque from the electrostatic motor. These devices can not only monitor whether or not the grounding system is connected, they can also monitor the quality/efficiency of the grounding system. Monitoring of the efficiency of the devices can furthermore be used to quantify or detect the event of a lightning strike hitting the structure. Moreover, one or more of the presented embodiments in combination can also be used to monitor the passage of current, which for example is critical for the lifetime of specific components installed in a structure, such as a wind turbine generator, and can in example diagnose if the neutral brush is not fully connected or damaged or worn off.

Part of this invention is related to harvesting from energy reserves from the ambient electrostatic energy which for example can be utilised to power monitoring systems. This ensures that monitoring systems are self-sufficient, self-contained and capable of operating without human intervention for a long period. This can reduce maintenance costs and provide economic benefits.

In an aspect, the output of the electrostatic motor is a function of collected charge conducted to the ground. The output may be a function of relative measures.

Such measures may include a measure of rotational speed of the electrostatic motor. The rotational speed is a very simple and robust indication. The rotational speed is easy to monitor and to communicate. The rotational speed may be a relative measure compared to a calibration value or simply a relative value compared to a reference value.

Such measure may be a measure of the torque of the electrostatic motor. The torque is easy to monitor and to communicate. The torque may be a relative measure compared to a calibration value or simply a relative value compared to a reference value.

A person skilled in the art will appreciate combining measured combinations thereof.

Measure may be relative to a respective calibrated measure performed against measure form a standard such as a grounding standard or procedure.

Standard IEC 61400-24 for lightning protection of wind turbines may be used as a reference. Standard IEC 61662 for lightning risk to a structure may be used. Standard IEC 61024-1 for lightning protection standard (earthing/grounding) may be used. Standard IEC 62305 for general standard may be used.

The measures or indications may be converted and transmitted by a transmitter connected to the system.

As an example, wind turbine structure's sensors can be installed in any place where there is a grounding path or earth cable (blade, hub cabinet, nacelle, azimuth level, sections, ground cabinet, etc.).

The measures or indicators may be quantitative, say "Good grounding: If the receiver doesn't detect voltage" the charge or current goes to the ground and is eliminated. "Faulty grounding: Signal will not be eliminated to the ground", a measurement is detected and a signal is sent as an alarm/warning message.

The measurements may be from the electrostatic motor and based on the rotational speed (in RPM) of the shaft or the torque on the shaft. The measurement may be of a voltage of a generator, driven by the torque from the electrostatic motor. Such measurement may be used to monitor and quantify the efficiency of the grounding system in a post processing of these collected data.

An indicator could also be "Insufficient grounding", in case the grounding connection is unstable or lost completely.

In an aspect there may be a further act of generating power by generator means driven by the torque on the axel or shaft from the electrostatic motor.

Thereby, it can be achieved that power can be generated at location and can reduce or eliminate the need for further power supply.

As an example, the following configuration can be used as a starting point for a system in a wind turbine generator. The electrostatic motor may be say a 24 VDC motor. The motor may operate with a rotational speed in a range of 0-420 RPM and generate a torque of about 0.5 Nm.

Such motor may drive a generator operating in say 0-2100 RPM and generate about 3 W as 6V.

A person skilled in the art will easily find required elements as off-the-shelf elements and make the required adjustments.

For a wind turbine generator, an exemplary setup has a generator output of 1-6.5V AC which may also be used as a measure. This output voltage AC can be converted to usable DC voltage to power the devices by means of a simple Power management circuit.

A gear may be inserted between the electrostatic motor and the generator.

In an aspect the monitoring of the grounding is powered by the power generated by the electrostatic motor. As such the monitoring may be a single standalone unit that can operate in or close to the structure.

In a wind turbine generator the monitoring may be performed say in a blade and the result of the monitoring may be transmitted wirelessly.

In an aspect, the acts outlined in diagnosing the grounding system is of a lightning protection system and the structure comprises parts of a wind turbine generator.

In an aspect, the structure comprises a blade, which may be a rotor blade of a wind turbine, and the act of monitoring includes an act of detecting a lightning strike. There may be an act of detecting electrostatic discharge. There may be combinations thereof.

In an aspect, the acts outlined in diagnosing the grounding system is of a lightning protection system and the structure comprises parts of a building, a bridge, or storage tanks of combustible fuels/gasses.

A person skilled in the art will be able to construct a grounding diagnostic system based on an electrostatic motor and means adapted to execute or perform the acts outlined.

A grounding diagnostic system may be configured to diagnose a grounding system of a structure and comprise a charge collecting structure that is conductively connected to ground. The connection to ground may be via a grounding path. Such grounding path may be by design and include specific conductors or connections that define a preferred path. A grounding path may also be inherent according to a design and be the path with the least resistance. A grounding path may also be a result of a fault, wear and tear or emerging short circuits.

A person skilled in the art and say operating wind turbine generators will appreciate that the correct path of the electrostatic energy discharge should be according to an installed lightning grounding system. This means from the collectors in the blades bypassing the blade bearings and through the hub and again passed the bearings of the rotating part of the drive train by neutral brushes to the grounding system.

As an example, if the neutral brushes are not well connected or damaged, there is a risk that the electrostatic energy, and lightning, will follow a path through the main shaft bearings and small sparks during discharge will damage the bearing balls or even worse through the gearbox or generator.

The grounding system may comprise an electrostatic motor configured to be connected to a connection path of the grounding system.

There may be a monitoring unit configured for monitoring an output of the electrostatic motor and/or monitoring the output of a generator connected to the electrostatic motor. The output may be as a function of collected charge, electrostatic potential, or charge conducted to ground.

The output may be rotational speed, torque or alike, as outlined previously. Such output is simple and robust and yet indicative.

In an aspect, the electrostatic motor is configured with power generating means to generate power. The power generating means may be a generator or dynamo of a size according to the circumstances. For a wind turbine generator the specifications may be as outlined.

In an aspect, the electrostatic motor is configured with power generating means to generate power and storage elements to store the power. The power generating means may be a generator or dynamo of a size according to the circumstances. The storage element can for example be a battery or supercapacitor or flywheel of a size according to circumstances. For a wind turbine generator the specifications may be as outlined.

In an aspect, the grounding diagnostic system is further configured with the power generating means powering the grounding diagnostics systems alone.

There may further be energy storage systems operating in connection with the power generating means. Such energy storage systems and power generating means (e.g. a dynamo) may include a power management system.

The harvested power or energy may be used for powering for example a sensor node, and may also be used for powering other electricity consuming devices.

The above disclosed may be used as a framework for wind turbine generators or any erected structure along with the electrostatic motor and storage system as an ambient static charge energy harvester. This energy can be utilised to power the grounding diagnostic systems or even an entire monitoring system making such systems self-reliant and self-contained.

Thereby, the system can be placed on one or more locations of the structure being diagnosed. Signals may be generated and transmitted and diagnosis can be performed at all times and with flexibility. A diagnostics system may comprise a unit in multiple wind turbine blades which each transmits measured output wirelessly to one or more central monitoring units. In such an installation, the grounding of respective blades can be monitored and relative differences can easily be detected. Units may be placed at other locations and ease or enable relevant references with fault detection and localisation.

The measured or monitored values may also be related to predestined values from other structures. As an example, a diagnostics system may be installed on multiple wind turbine generators and measurements from one wind turbine generator may be compared to measurements from one or more other wind turbines.

A person skilled in the art will appreciate the aspect where a computer program product is established that comprises instructions to cause the grounding diagnostic system to perform the acts involved in diagnosing.

The above diagnosing can be performed or the diagnosing system can be configured with reference values according to specifications such as standards or operating procedures related to a structure e.g. a wind turbine generator.

The diagnostics may be done by monitoring measurements from two blades on the same wind turbine generator that experience exactly the same environmental conditions at the same time.

The diagnostics may be done by monitoring measurements from multiple wind turbine generators in a farm that experience exactly the same environmental conditions at the same time.

In an aspect, there is a method of diagnosing a grounding system of a structure comprising a charge collecting structure conductively connected to ground via a grounding path and wherein diagnosing involves an act of monitoring outputs of a voltage detector connected to the grounding path.

A voltage detector can be used or a device indicating the passage of voltage or electrostatic discharge in a cable.

As an example, a Rogowski coil, a current sensor or any similar device, which measures the passage of charges, may be used.

As an example, the voltage detector is a contactless voltage detector device blinking periodically according the voltage levels. Such detector may be a voltage detector for a bus bar, which device is suitable for the continuous indication of voltage being present on bus bars and other equipment: Off-the-shelf detectors may operate a nominal voltage of 10-36 kV.

In an aspect, diagnosing involves an act of comparing outputs of at least two voltage detectors connected at two different points of the grounding path.

As an example, monitoring the status of the neutral brush on a wind turbine generator may be possible using measurements from two voltage detectors. If the neutral brush is healthy and working as intended, the voltage detector one will measure the whole or the highest amount of energy during the discharging in comparison to voltage detector two, which is measuring the voltage on the nearest grounding cable.

If voltage detector two measures most of the energy or higher than the default, the system knows that the neutral brush is not providing the most efficient connection to the grounding system—and grounding has found an alternative route.

According to the neutral brush or grounding system complexity, multiple voltage detectors can be installed to check the right path of the discharging energy as needed.

In an aspect, there is a grounding diagnostic system having two voltage detectors and means adapted to execute the acts as described.

In an aspect, of diagnosing a grounding system of a structure, diagnosing is performed as a function of measures based on one or more electrostatic motors and one or more voltage detectors as outlined.

In an aspect, there is a grounding diagnostic system having an electrostatic motor and means adapted to execute the acts outlined and having one or more voltage detectors and means adapted to execute the acts as outlined.

In general, a method is disclosed of determining grounding of a grounding system of a wind turbine generator. The method comprises acts that involve building up electric charge in a capacitor, say by collecting electrostatic charge from at least one wind turbine blade.

There is an act of discharging the capacitor at a discharge charge level or discharge voltage at a point on the wind turbine blade. There is an act of measuring a grounding charge level or grounding voltage at a grounding system point of the wind turbine. There is an act of determining grounding of the grounding system as a function of the discharge charge level or discharge voltage and the grounding charge level or grounding voltage.

The grounding system point may be located in the nacelle, in the tower, or blade of the wind turbine generator (WTG).

As outlined above, a rotating electrostatic generator or motor may be implemented as disclosed. Such implementation provides for additional diagnostics or methods of diagnosing. In relation to wind turbine generators, several usages of a rotating electrostatic motor may apply for such diagnostics or methods of diagnosing.

There may be a use of a rotating electrostatic motor arranged in a wind turbine generator to diagnosing an operational condition of the wind turbine generator. There may be a method of diagnosing operational conditions of a wind turbine generator, which is performed by use of a rotating electrostatic motor arranged in a wind turbine generator.

In an aspect, diagnosing is of degeneration in the wind turbine blades of the wind turbine generator (WGT). There may be a method of diagnosing degeneration of a wind turbine generator by use of a rotating electrostatic motor.

Thus, the electrostatic motor can be used to detect the degradation in the wind turbine blades. The blade degradation or corrosion may be of the type of leading-edge erosion that may occur in the long-term operation wind turbine. Other types of more event-like types of degeneration may be sudden damages that occur and can be observed as "steps" in the diagnostic output. As an example, an increase of the surface roughness of the blades will ultimately lead to higher static charge formation, and thus the surface roughness can be found, reversibly.

In an aspect, the diagnosing is performed by comparing a diagnostic output from a rotating electrostatic motor coupled to one blade with a diagnostic output from another rotating electrostatic motor coupled to another blade on the same wind turbine generator.

In an aspect, the diagnosing is performed by comparing a diagnostic output from a rotating electrostatic motor coupled to one blade with a diagnostic output from another rotating electrostatic motor coupled to a similar blade of another wind turbine generator.

In an aspect, the diagnosing is performed by comparing a diagnostic output from a rotating electrostatic motor coupled to one blade with a reference value. The reference value may be from the group of blades of the blade type. The reference value may be of historical data from the actual blade itself.

In an aspect, data may be collected in the same time slot from one or more other blades on this specific wind turbine generator. Alternatively, data may be collected in the same time slot from one or more other blades from other wind turbines in the same wind farm.

Using the above disclosed implementations, a change such as an increase in static charge can be identified through monitoring the speed and behaviour of the electrostatic motor. To distinguish this from the poor grounding scenario outlined, minor modifications are required, which can be by characterising the motor behaviour under for example, leading edge erosion of a blade. In an implementation, the diagnostic may be used to define a machine learning algorithm which can self-identify these characteristics. The algorithms can make decisions or diagnosis by one or more of the following. By comparing measured output from electrostatic motor with that of the motors in other blades of same turbine. By comparing measured output from electrostatic motor with that of the motors in other blades of turbines of same type in same farm. By comparing the output of the motor to a reference value.

In an aspect, the diagnosing is of a grounding system of the wind turbine generator as outlined above.

In an aspect, the diagnosing is of a wind speed under which the wind turbine generator is operating. There may be a method of determining wind speed experienced by a wind turbine generator, the method comprises use of a rotating electrostatic motor.

The static charge generated on the blades is dependent on the wind speed, thus reversely the diagnostic output of the rotating electrostatic motor may determine the windspeed. The higher the wind speed, the higher the charge. Therefore, by monitoring the output of the electrostatic motor, correlating with other factors like temperature, atmospheric pressure etc. and using a suitable computer algorithm, calculation of wind speed can be achieved. This may be further advantageous and significant as it allows to achieve higher accuracies in wind speed measurements than using anemometer placed at the backside of a wind turbine since their measurements are affected by the wake effect. The measurement of wind speed can for example be used in the improving of the control of a wind turbine.

A further use of a rotating electrostatic motor may be to kick start or give a start torque to get the motor operational. Such kick starting may be done using the generator which is coupled to the rotating electrostatic motor for power generation. By momentarily running the generator as a motor at the beginning of the operation, the necessary starting torque for the electrostatic motor can be provided. It may be an advantage for the generator to be connected in such a way that the starting torque is in the direction to ensure sustained operation of the motor.

Another way to initiate the starting torque or kick starting, may be by using the centrifugal forces acting on the motor as a result of the rotating blade. Through this, the need for an external provider for starting torque can be eliminated. In this case, the motor should be placed in the blade such that the centrifugal forces exert the starting torque in the direction so that the motor can sustain the operation.

A further use of a rotating electrostatic motor may be the diagnosing of a lightning strike of the wind turbine generator. There may also be a use of a rotating electrostatic motor where diagnosing is performed discriminating between a lightning event and electric charge accumulation. The outlined output from the rotating electrostatic motor, e.g. voltage, torque etc, has shown to comprise distinctive characteristics that can be associated with respective lightning and electrostatic charge.

The use of the rotating electrostatic motor may be such that the diagnosing of lightning includes accessing characteristics of the output from the rotational electrostatic generator at either the wave front, wave tail, or both.

Thus, the rotating electrostatic rotor implemented in a wind turbine generator as disclosed can be used to quantify the characteristics of a lightning, e.g. lightning current. Realizing this use, then when lightning strike, the motor will accelerate, and the speed profile of the motor tend to follow the waveform of the lightning strike. Thus, using a suitable computer algorithm, and using the historical speed behavior, the wave shape can be reconstructed i.e. the wave front and tail. Along with this, using the absolute speed value of the motor, the charge associated with the strike can be estimated. As outlined above, this can be used to differentiate between a lightning event and electrostatic charge accumulation under normal operation. Measuring and accounting for other parameters like measured wind speed, humidity can also be used to characterize or diagnose events. Such analysis may be implemented in the computer algorithm.

BRIEF DESCRIPTION OF THE FIGURES

Embodiments of the invention will be described in the figures, whereon.

DETAILED DESCRIPTION

| Item | No |
|---|---|
| Structure | 1 |
| Wind Turbine Generator (WTG) | 12 |
| Tower | 13 |
| Rotor | 14 |
| Nacelle | 19 |
| Blade | 22, e.g. 22A, 22B, 22C |
| WTG generator | 28 |
| WTG gearbox | 30 |
| Sensor node | 45, 45A, 45B, 45C |
| Collection cabinet | 50 |
| Communication module | 54 |
| Grounding system/ Grounding diagnostic system | 100 |
| Lightning protection system | 102 |
| Charge collecting structure | 120 |
| Grounding path | 122 |
| Grounding path point | 124I, 124II |
| Grounding path critical transition | 126 |
| In-correct grounding path | 128 |
| Voltage and/or current and/ or electrostatic detector | 130, 130I, 130I |
| Electrostatic motor | 140 |
| Output | 142, 142I, 142II |
| Generator means | 150 |
| Generator | 152 |
| Power management circuit | 154 |
| Energy storage | 156 |
| Gearbox | 160 |
| Power transmission | 170 |
| Other power consuming installations | 180 |
| Ground | 190 |
| Lightning strike | 192 |
| Electrostatic discharge | 194 |
| Method of diagnosing | 1000 |
| Monitoring | 1100 |
| Generating | 1200 |
| Detecting | 1300 |
| Comparing | 1400 |

Figure 1:
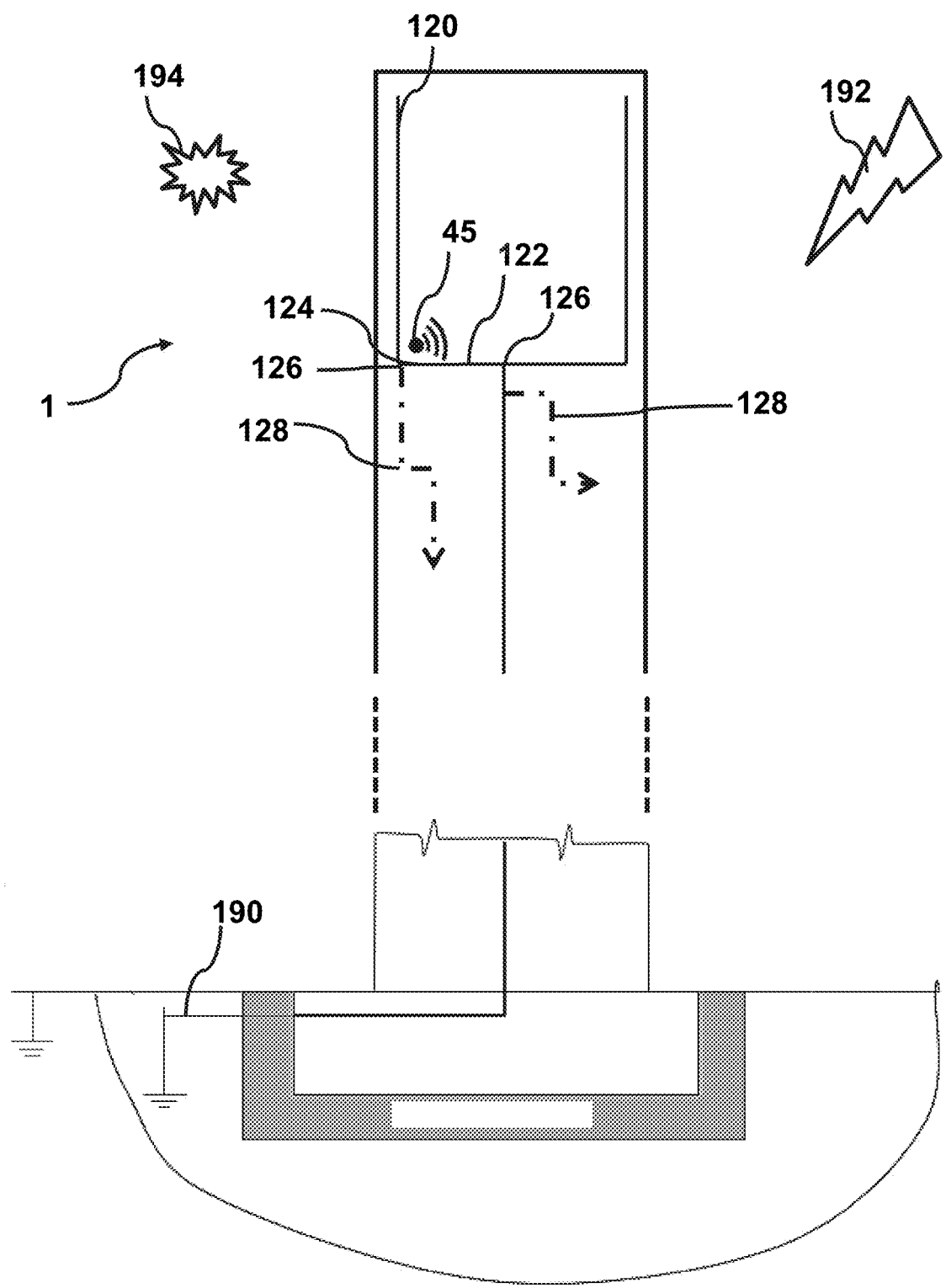
FIG. 1 illustrates a structure with a charge collecting structure and a grounding path, according to an example.

FIG. 1 illustrates a structure 1 with a charge collecting structure 120 and a grounding path 122.

The ambient atmosphere to the structure 1 can create charge by lightning strike 192 or static charge 194 by interaction between the atmosphere and the structure 1 due to a relative movement between the atmosphere and the structure 1.

The relative movement can be due to wind or wind and sand or due to the structure 1 having one or more moving parts.

The structure 1 has the charge collecting structure 120 with a grounding path 122, wherein the grounding path 122 is designed for the structure 1 such that the structure 1 is controllably grounded. The grounding path 122 is connected to the ground 190.

The charge may arise from electrostatic discharge 194 or from lightning 192.

However, the grounding may happen by one or more in-correct or missing grounding paths 128, which causes a current to travel along the in-correct grounding paths 128. This may cause damage to equipment or may uncontrollably generate sparks, which in worst case may cause a fire.

The in-correct grounding path 128 may happen anywhere along the grounding path 122 due to fatigue or errors in equipment. However, any structure 1 will typically have one or more grounding path critical transitions 126, wherein the risk of having an in-correct grounding path 128 is higher.

A grounding path critical transition 126 can be a transition between a rotational element and a stationary element.

In FIG. 1 the grounding path 122 has two grounding path critical transitions 126 and two associated in-correct grounding paths 128.

The structure 1 is equipped with a sensor node 45 for monitoring grounding path 122 at a grounding path point 124 which is at one of the grounding path critical transitions 126; thereby, the sensor node 45 can determine whether the charge is grounded via the intended grounding path 122.

The sensor node 45 may be part of a not shown grounding diagnostics system 100.

Figure 2:
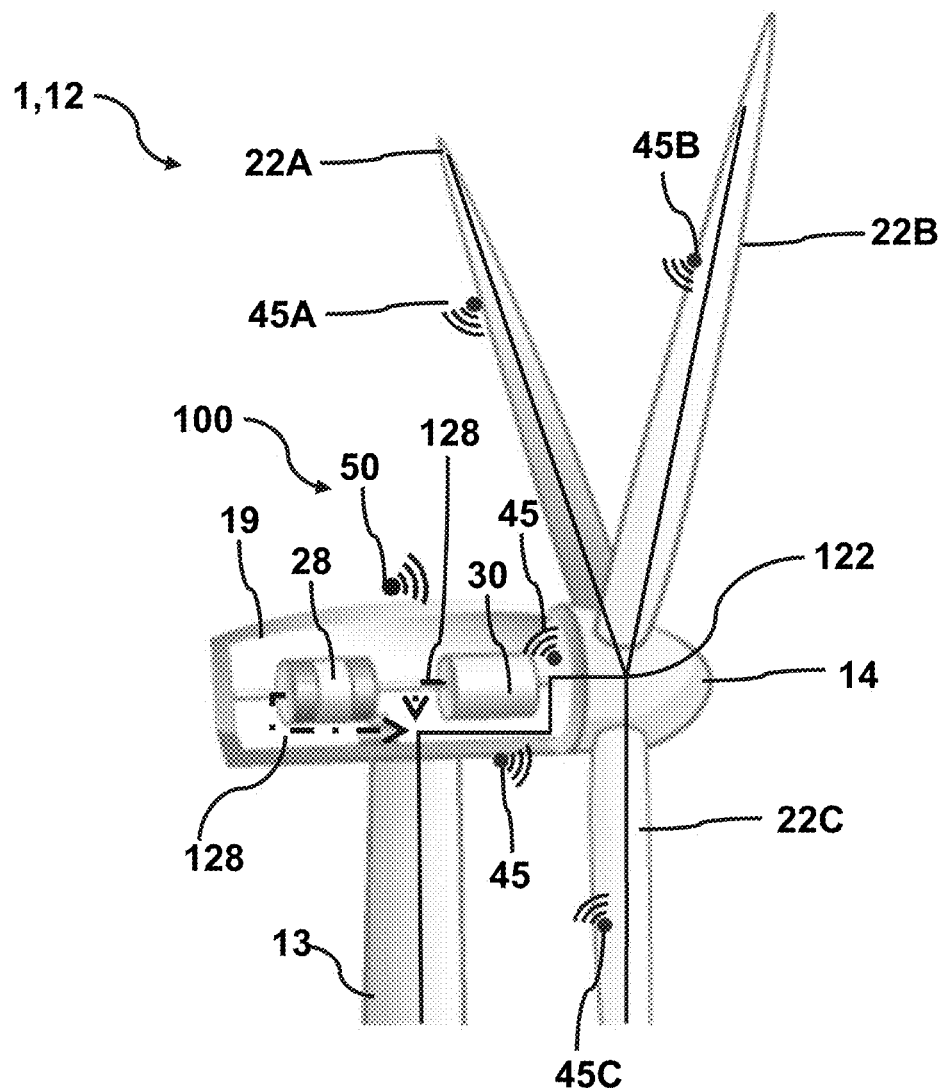
FIG. 2 illustrates a wind turbine generator structure with a grounding diagnostics system where the voltage detectors are used with sensor nodes, according to an example.

FIG. 2 illustrates a wind turbine generator (WTG) 12 structure 1, with a grounding diagnostics system 100.

The WTG 12 is a structure 1, wherein grounding due to charge generation is needed.

The WTG 12 comprises a tower 13, a nacelle 19 with a WTG generator 28 and WTG gearbox 30 connected via a rotor 14 to blades 22A, 22B and 22C.

The structure 1 has a grounding path 122 illustrated with the black and solid line. The figure discloses two possible in-correct grounding paths 128 through the WTG generator 28 and the WTG gearbox 30, which may cause damage to the respective equipment.

Although not specifically disclosed, the blades 22A, 22B, 22C, where the main part of the charge is generated due to collision with the ambient atmosphere, are susceptible to have in-correct grounding paths 128. This may happen due to wear on neutral brushes which wear out over time due to friction from turbine operation. This, however, needs periodic maintenance and replacement if necessary, and, related to this, correct spare parts can be installed or serviced incorrectly, or incorrect spare parts not feasible for the specific application can be used.

Thus, each of the blades 22A, 22B, 22C are equipped with a sensor node 45A, 45B, 45C configured for at least monitoring whether the corresponding blades 22A, 22B, 22C are grounded along the intended grounding path 122.

The structure 1 also has a sensor node 45, voltage and/or current and/or electrostatic detector 130 at the interface between rotor 14 and nacelle 19.

The structure 1 also has a sensor node 45, voltage and/or current and/or electrostatic detector 130 at the interface between the tower 13 and nacelle 19.

The nacelle 19 is equipped with a collection cabinet 50 being in communication with the different sensor nodes 45, 45A, 45B, 45C via a not shown communication module 54. The collection cabinet 50 and the sensor nodes 45, 45A, 45B, 45C form part of the grounding diagnostic system 100.

Thereby, the grounding diagnostic system 100 will be able to at least monitor the grounding path 122 such that if a change is monitored at blade 22A, there will likely be an in-correct grounding path 128 in the blade 22A.

Thus, when electrostatic electricity (or lightning) is generated in the blades 22, it is being discharged correctly from the blades 22. The electrostatic electricity (or lightning) does NOT pass through bearings (WTG gearbox 30 and or WTG generator 28 etc.)— but the electrostatic electricity (or lightning) must avoid the bearings (WTG gearbox 30 and or WTG generator 28 etc.) by following the grounding system 100 being designed with the grounding path 122.

Figure 3:
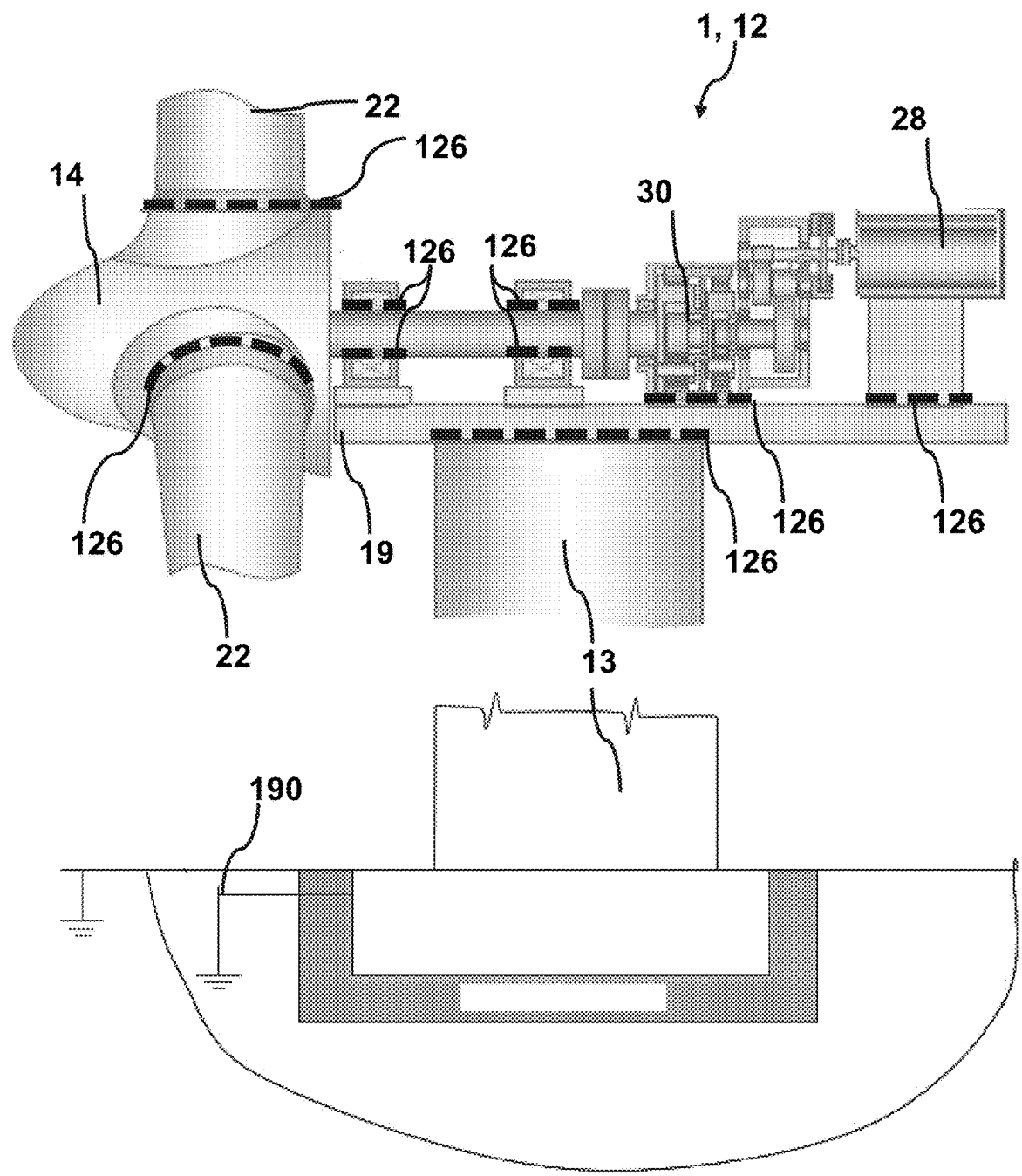
FIG. 3 illustrates a wind turbine generator with grounding paths, according to an example.

FIG. 3 illustrates a wind turbine generator 12 with grounding paths.

The wind turbine generator (WTG) 12 is a structure 1. The WTG 12 comprises a tower 13, a nacelle 19 with a WTG generator 28 and WTG gearbox 30 connected via a rotor 14 to blades 22.

The WTG 12 is connected to the ground 190.

The figure discloses grounding path critical transitions 126 for the WTG 12. The grounding path critical transitions 126 are at transitions between moving parts of the WTG 12, and at the WTG generator 28 and the WTG gearbox 30 connection with the nacelle 19, because it is important that the WTG 12 is not grounded through said parts.

Thus, when electrostatic electricity (or lightning) generated in the blades 22 is being discharged correctly from the blades 22, the electrostatic electricity (or lightning) does NOT pass through bearings (WTG gearbox 30 and or WTG generator 28 etc.)— but the electrostatic electricity (or lightning) must avoid the bearings (WTG gearbox 30 and or WTG generator 28 etc.) by following the grounding system 100 being designed with the grounding path 122.

Figure 4:
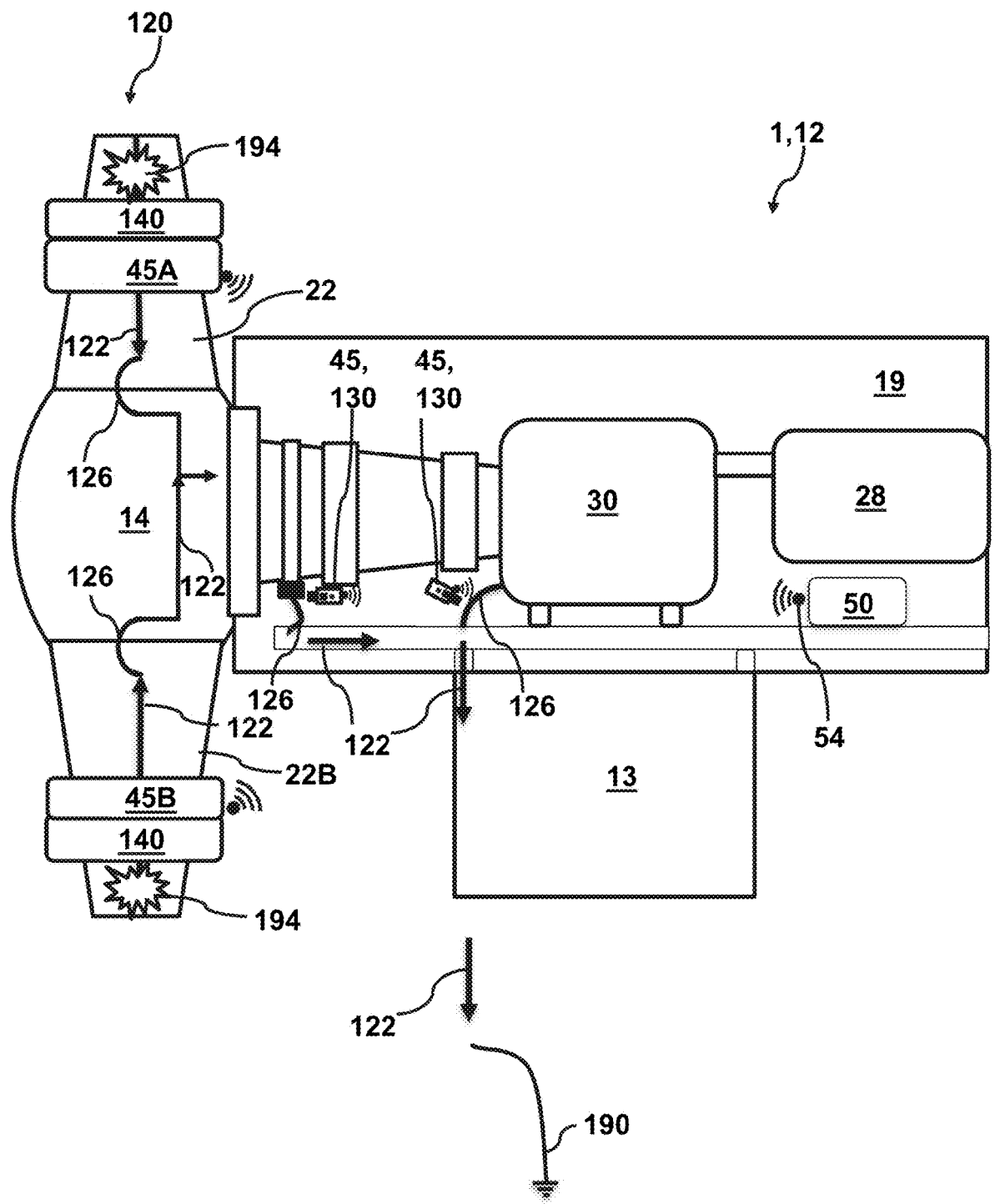
FIG. 4 illustrates a rotor and nacelle system with sensors for diagnosing grounding, according to an example.

FIG. 4 illustrates a rotor 14 and nacelle 19 system with sensors 45 for diagnosing grounding.

The WTG 12, structure 1 is equipped with a charge collecting structure 120, wherein blades 22A, 22B and the nacelle 19 are connected to the ground 190 through the tower 13. The grounding path 122 from blades 22 to the ground 190 is shown with bold arrows.

The transitions between the blades 22A, 22B and the rotor 14 are grounding path critical transitions 126 wherein neutral brushes are designed to ensure the correct grounding path 122. However, the neutral brushes experience high amounts of wear and tear and are thus prone to breakage or drop in function over time.

This will cause the grounding to find an alternative route, which worst case is through the bearings. Such an alternative route is denoted an in-correct grounding path 128.

The blades 22 will experience electrostatic discharge 194 due to build-up of charge. The blades 22 are grounded by the grounding path 122.

The WTG 12 structure 1 is equipped with a grounding diagnostic system 100 monitoring whether the WTG 12 structure 1 is grounded along the grounding path 122 or whether the system is grounded along an in-correct grounding path 128 (not shown in FIG. 4).

The grounding diagnostic system 100 comprises different types of sensors, depending on whether the sensor node 45 is placed in the blade 22 or in the nacelle 19.

Each blade 22 is equipped with an electrostatic motor 140, which is powered by the electrostatic charge. The electrostatic motor 140 has an output 142 (not shown), which can at least be quantified such that a sensor 45 can monitor the grounding path 122.

However, the output 142 of the electrostatic motor 140 can be used to power the sensor monitoring the grounding path 122. In some embodiments, the electrostatic motor 140 may even power other sensors not related to the grounding diagnostic system or be used to power a low power consuming de-icing system.

The sensor node 45 may monitor the efficiency of the electrostatic motor 140 and thereby be able to determine whether the grounding is along the grounding path 122.

As an example, if the sensor node 45 measures a sudden drop in efficiency or power generated, it will likely be due to the grounding being along an in-correct grounding path. This may be caused by breakage or damage of one or more of the neutral brushes in the blade 22 such that the grounding is along an in-correct grounding path 128.

Figure 7:
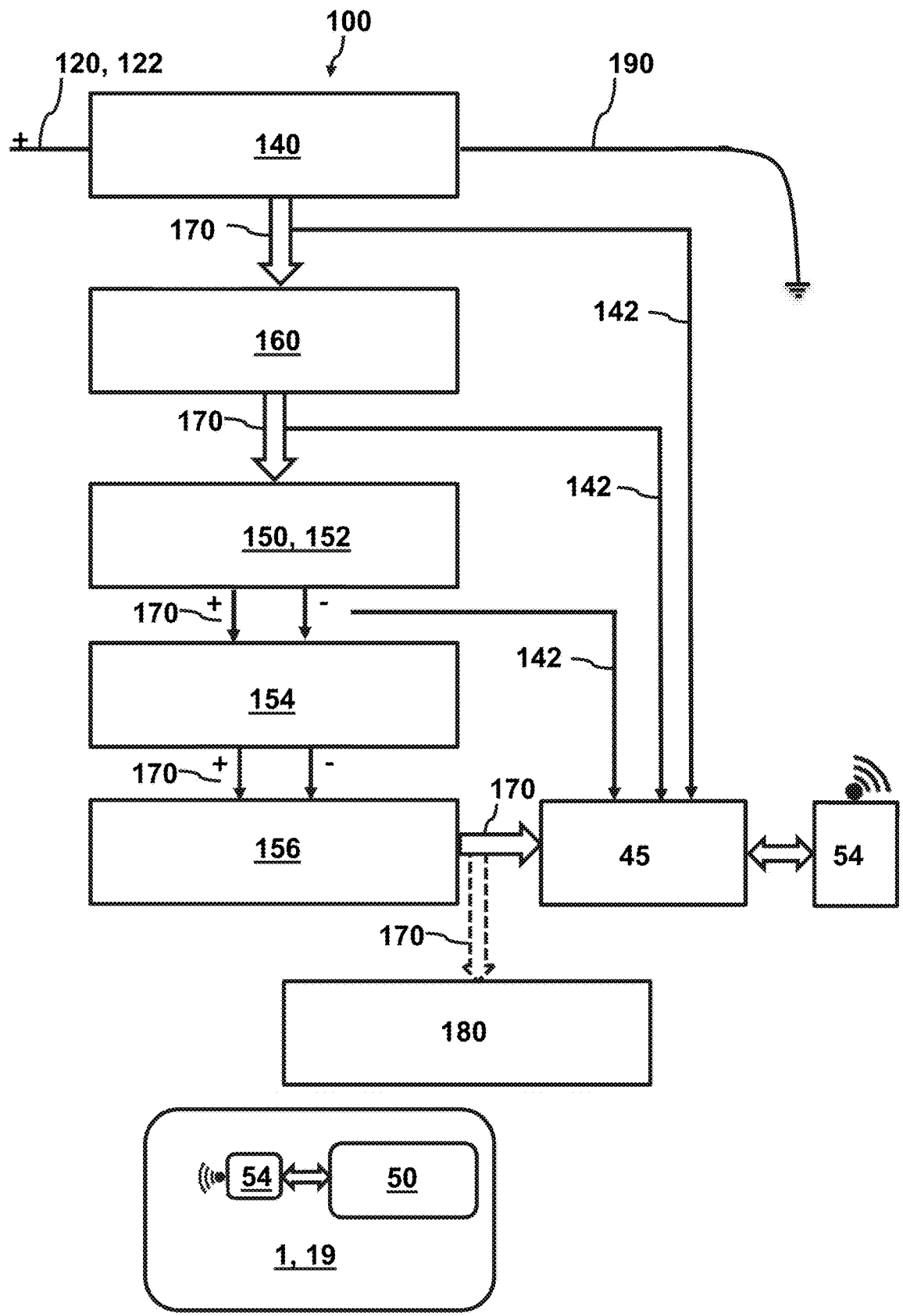
FIG. 7 illustrates a configuration of ground diagnosing using an electrostatic motor and with electrostatic energy harvesting, according to an example.
Figure 8:
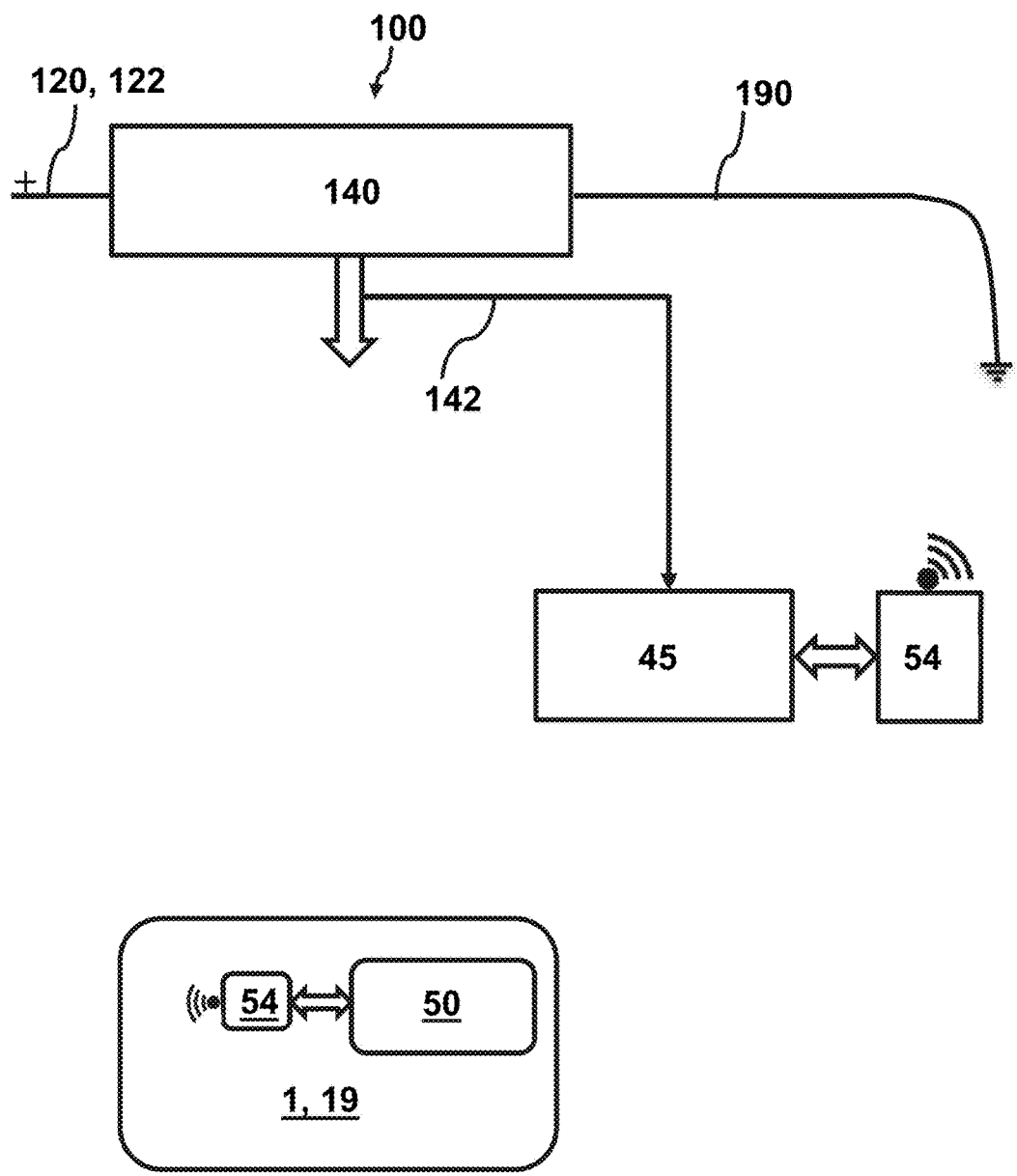
FIG. 8 illustrates a configuration of direct ground diagnosing using electrostatic motor, according to an example.

Examples of the sensor node 45 and electrostatic motor 140 are disclosed in FIGS. 7 and 8.

The two sensor nodes 45 in the nacelle 19 may monitor output from a voltage detector 130 or a current detector in combination with an output from an electrostatic motor 140.

The sensor node 45 may perform monitoring and comparing of two or more sensory outputs.

The sensor node 45 include sensory output from the electrostatic motor 140 and the sensory output may be handled by the sensor node 45, which may be independent of the voltage detector 130 or a current sensor. The sensor node 45 may comprise an accelerometer, temperature sensor or any other sensor. The sensor node 45 may include a processor (microcontroller/microprocessor) or any processing unit where all computational logic may be implemented. By taking the inputs from electrostatic motor 140 or voltage detector 130/current sensor or any similar sensor to detect the passage of charges, this can process the measured values/information and transmit an alarm or signal via the communication module if necessary, e.g. to a collection cabinet 50 in nacelle 19.

The sensor node 45 communicates with the collection cabinet 50 which is also equipped with a communication module 54.

The voltage detector 130 may be self-powered, wherein a light emitter is adjusted to blink as a function of the voltage level. The voltage level is a direct measurement of the efficiency of the grounding cable. This is disclosed in greater detail in FIG. 9.

The sensor nodes 45 communicate through a collection cabinet 50 either wireless or by wire. The sensors 45 in the blades 22 will typically communicate wireless such as via radiofrequency.

The collection cabinet 50 may have means for performing a method of diagnosing or have means to communicate through a central server from where the method of diagnosing can be performed.

The processing of data can in principle be done locally in the sensor node 45. The processing may be performed locally in between more than one sensor nodes 45. The processing may be performed in the data collection box in the structure, e.g. in a wind turbine generator. The processing may be performed in a central server where data is transferred to and processed.

The correct path of the electrostatic energy discharge is according to the arrows on the first slides (following the installed lightning grounding system): this means from the collectors in the blades bypassing the blade bearings and through the hub and again bypassing the rotating part of the drive train by neutral brush(es) to the grounding system.

If the neutral brush(es) are not well connected or damaged, there is a risk the electrostatic energy (and lightning) will go through either the main shaft bearings and the small sparks will damage the bearing balls, or even worse will go through the gearbox or generator and damage those main components.

Monitoring the status of the neutral brush is possible using measurements from two sensors which may be a voltage detector 130, or current sensor, or any similar sensor for detection of passage of charges.

Thus, in the simplest ground diagnostic system 100 only two measurements along the grounding path are needed. However, due to general complexity of a wind turbine generator 12 the grounding diagnostic system may have more sensors (current sensor/voltage detector or any similar) or sensor nodes 45 to divide the diagnostic of the grounding path 122 into several stretches or paths.

Thus, if sensor node 45X+1 measures a higher energy or voltage than the sensor node 45X there is an in-correct grounding path before sensor node 45X.

Figure 5:
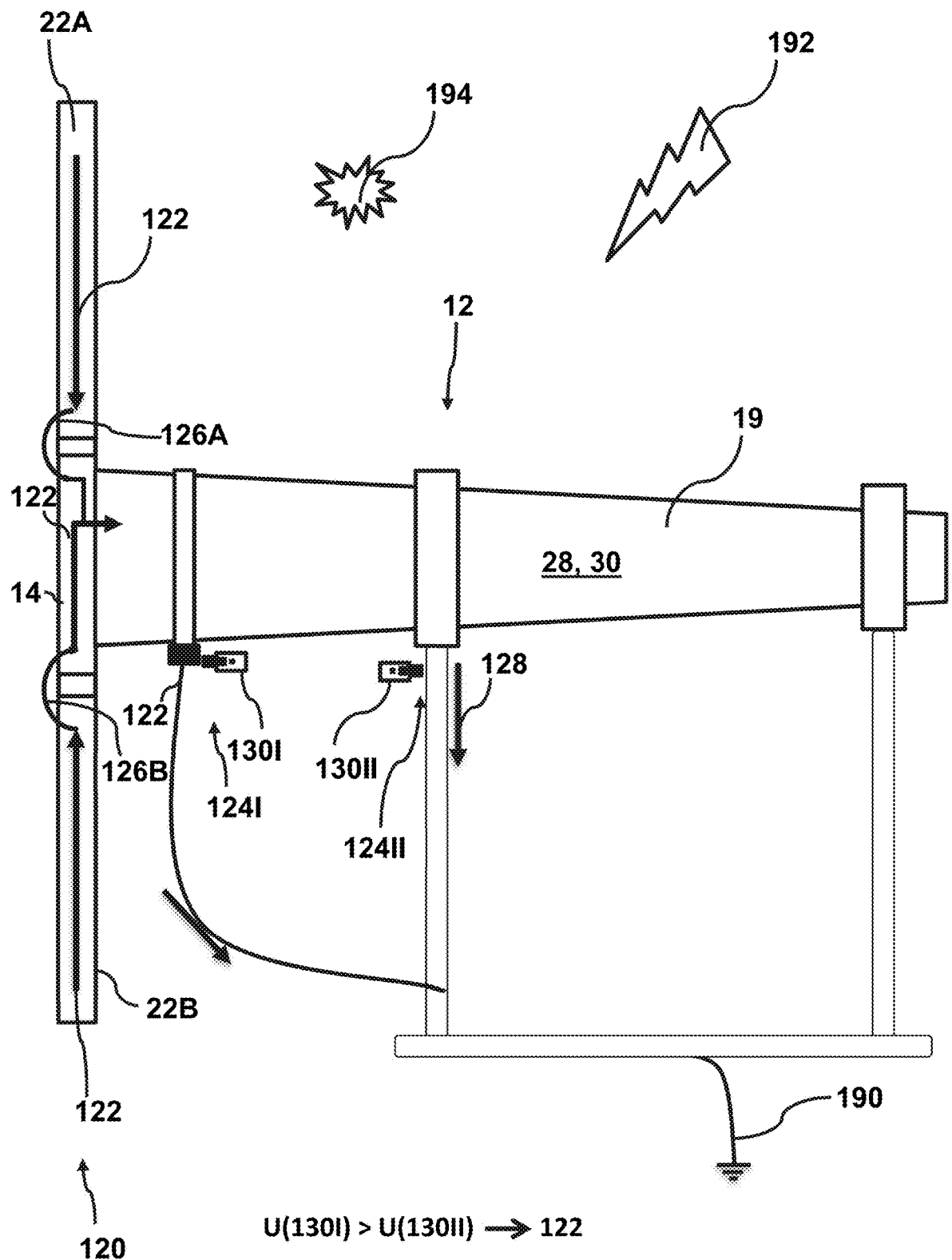
FIG. 5 illustrates a wind turbine generator with a grounding system in a nacelle—with grounding along a grounding path, according to an example.

FIG. 5 illustrates a wind turbine generator 12 with a grounding system in a nacelle 19—with grounding along a grounding path 122. The figure should be seen in connection with FIG. 6, which shows a situation wherein the grounding is along an in-correct grounding path 128.

The WTG 12 comprises blades 22 connected to the nacelle 19 via a rotor 14. The blades 22 will function as a charge collecting structure 120 and will experience lightning strikes 192 and electrostatic discharge 194.

The grounding system 100 comprises a grounding path 122 designed to transport the charge to the ground 190, such that sensitive equipment is protected, e.g. bearings, WTG gearbox 30 or WTG generator 28.

In the present case, the nacelle 19 is equipped with two voltage detectors 130I, 130II positioned at two different grounding path points 124I, 124II.

The voltage detector 130I is positioned along the intended grounding path 122.

The voltage detector 130II is positioned along an in-correct grounding path 128.

Both voltage detectors 130I, 130II may be contactless voltage detectors.

Although voltage detectors are positioned at the nacelle 19, they can be used to determine whether one or more neutral brushes at the blades 22A, 22B are damaged or otherwise works improperly. The neutral brushes are indicated by a grounding path critical transition 126A, 126B.

In this case, the neutral brushes work as intended, thus the voltage detector 130I will measure the highest voltage during the discharging and the voltage detector 130II will measure a small voltage or no voltage during the discharge. Thus, U(130I)>U(130II).

In this case the risk of damaging the bearings, WTG gearbox 30 or WTG generator 28 is minimized.

Figure 6:
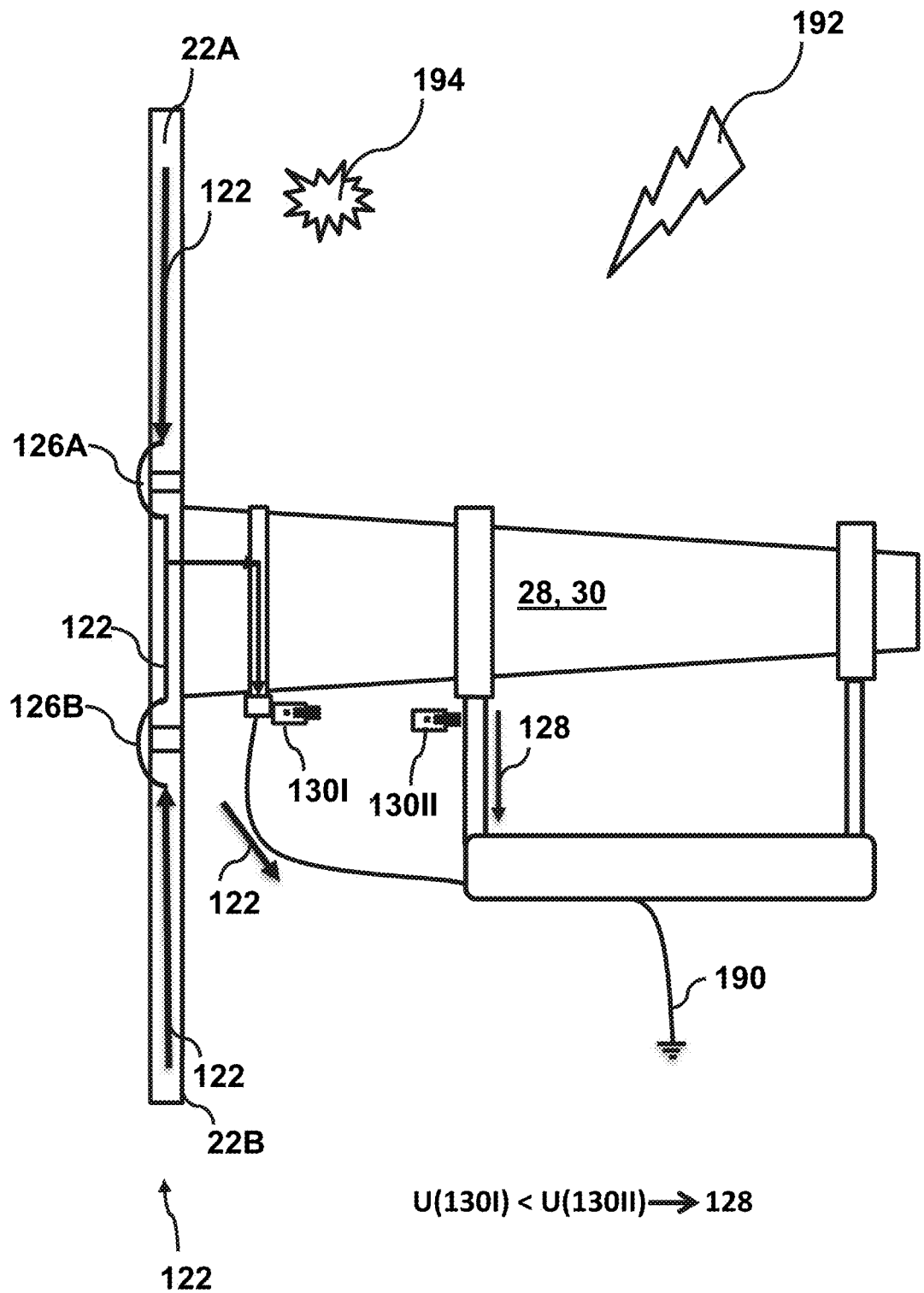
FIG. 6 illustrates a wind turbine generator with a grounding system in a nacelle—with grounding along an in-correct grounding path, according to an example.

FIG. 6 illustrates a WTG 12 with a grounding system in a nacelle 19 with grounding along an in-correct grounding path 128. The figure should be seen in connection with FIG. 5, which shows a situation wherein the grounding is along a correct grounding path 122.

The WTG 12 and grounding diagnostic system 100 is identical to the WTG 12 of FIG. 5.

In this case, one or more of the neutral brushes are defected and the grounding does not follow the path over the critical grounding transition 126A, 126B. The grounding then follows another path, which is an in-correct grounding path 128. The in-correct grounding path can be through the bearings, WTG gearbox 30 or WTG generator 28.

In this case, the voltage detector 130II will measure the highest voltage during the discharging and the voltage detector 130I will measure a small or no voltage during the discharge. Thus, U(130II)>U(130I).

In this case, the risk of damaging the bearings, WTG gearbox 30 or WTG generator 28 is high, because the charge travels through the sensitive equipment.

I.e. if the neutral brush(es) are not well connected or damaged, there is a risk, the electrostatic energy (and lightning) will go through either the main shaft bearings and the small sparks damaging the bearing balls, or even worse will go through the gearbox or generator and damage those main components.

FIG. 7 illustrates a configuration of a ground diagnosing system 100 using an electrostatic motor 140 and with electrostatic energy harvesting.

Each power transmission 170 is disclosed by one or more arrows between the different elements.

The electrostatic motor 140 is connected to a charge collecting structure 120 of a not shown structure 1. The structure 1 may be any of the structures 1 shown in FIG. 1-6.

The electrostatic motor 140 is positioned along a grounding path 122 of the charge collecting structure 120 and is thus connected to the ground 190.

The electrostatic motor 140 drives a shaft connected to a gearbox 160, which is connected to generator means 150 such as a generator 152, wherein the generator 152 generates electric power.

In some embodiments, the electrostatic motor 140 drives a shaft directly connected to a generator means 150 such as a generator 152, wherein the generator 152 generates electric power.

The generator means 150 or generator 152 is connected to a power management circuit 154 which is connected to energy storage 156, such as a cell or battery or capacitor or super capacitor or any similar storage components.

The energy storage 156 powers a sensor node 45.

The energy storage 156 may in addition power other power consuming installations.

This is particularly useful in a rotor or blade wherein there is otherwise limited power.

The sensor node 45 may monitor an output 142 from the electrostatic motor 140; this can be a RPM measurement of the shaft for classification of the charge collecting structure.

This can also be a torque measurement of the shaft for classification of the charge collecting structure.

A drop in the voltage would cause the RPM or the torques values to lower.

The sensor node 45 could likewise measure an output 142 of the gearbox 160, the output 142 of the gearbox 160 could be the RPM or the torque of a shaft of the gearbox 160.

The sensor node 45 could likewise measure an output 142 of the generator means 150 or generator 152 such as a voltage.

The sensor node 45 communicates by wire or wireless with a collection cabinet 50 having a communication module 54, the collection cabinet 50 being positioned in a structure 1 or nacelle 19.

Thereby, the ground diagnosing system 100 is able to monitor the quality of the grounding connection from the structure 1 or the blades 22 while utilizing static electricity for power generation.

The ground diagnosing system 100 will be able to:
perform quantization of lightning strikes 192
estimate intensity of lightning strikes 192
monitor static discharge—efficiency of grounding
power generation and energy storage 156
power sensor node 45 and other power consuming installations.

FIG. 8 illustrates a configuration of a direct ground diagnosing system 100 using an electrostatic motor 140;

The electrostatic motor 140 is connected to a charge collecting structure 120 of a not shown structure 1. The structure 1 may be any of the structures 1 shown in FIG. 1-6.

The electrostatic motor 140 is positioned along a grounding path 122 of the charge collecting structure 120 and is thus connected to the ground 190.

The electrostatic motor 140 may drive a shaft.

The sensor node 45 may monitor an output 142 from the electrostatic motor 140, this can be a RPM measurement of the shaft for classification of the charge collecting structure.

This can also be a torque measurement of the shaft for classification of the charge collecting structure 120.

A drop in electrostatic charge would cause the rotational speed or the torque's values to lower.

The sensor node 45 communicates by wire or wireless with a collection cabinet 50 having a communication module 54, the collection cabinet 50 being positioned in a structure 1 or nacelle 19 or even outside the structure at any given location.

Figure 9:
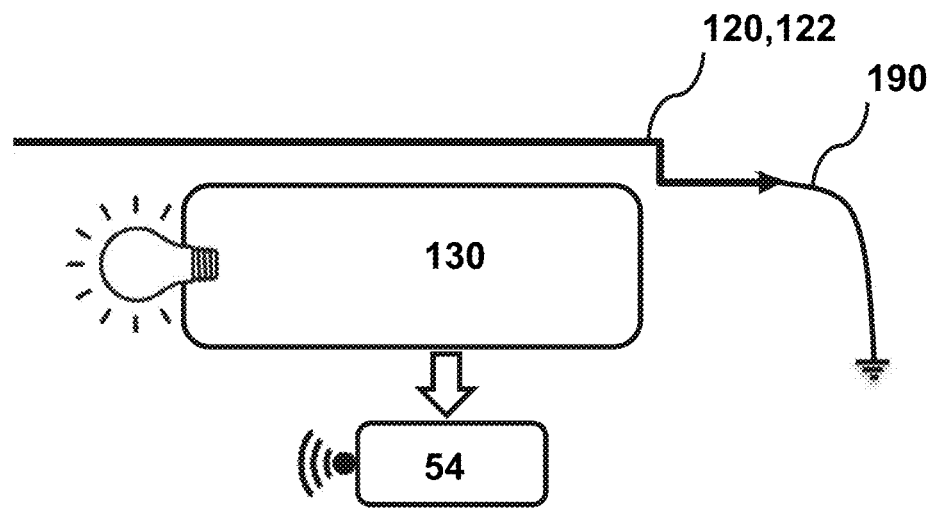
FIG. 9 illustrates a configuration of direct grounding diagnostics using voltage and/or current and/or electrostatic detector, according to an example.
Figure 9:
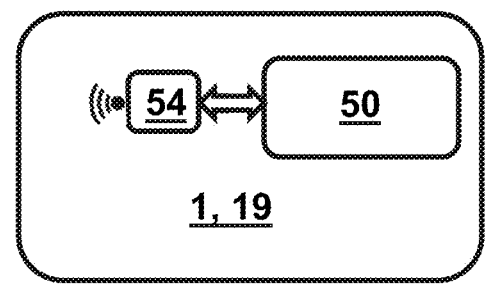

FIG. 9 illustrates a configuration of direct grounding diagnostics 100 using voltage detector 130. The voltage detector 130 is typically positioned near a grounding path 122 of the charge collecting structure 120 to the ground 190.

The voltage detector 130 may be positioned on or near a critical structure such as bearings, where the voltage detector 130 should not measure a voltage and if the voltage detector 130 measures a voltage, this is due to an in-correct grounding path 128.

The voltage detector 130 can be a contactless voltage detector 130, which blinks periodically according to the voltage level.

The voltage detector 130 can be a detector called VKP-FF-35.

The voltage detector 130 has a light emitter, wherein the light blinking period is correlated to the voltage level, which is a measurement of the efficiency of the grounding path.

However, the blinking period i.e. output signal of the voltage detector 130 can be monitored by a sensor node and transfer a signal wirelessly (or by wire) to the data collection cabinet. Alternatively, a visual inspection camera may be used to monitor the blinking period.

The voltage detector 130 communicates by wire or wireless with a collection cabinet 50 having a communication module 54, the collection cabinet 50 being positioned in a structure 1 or nacelle 19.

The voltage detector 130 setup may be implemented alone as disclosed. It may be optional in connection with an electrostatic motor setup.

Figure 10:
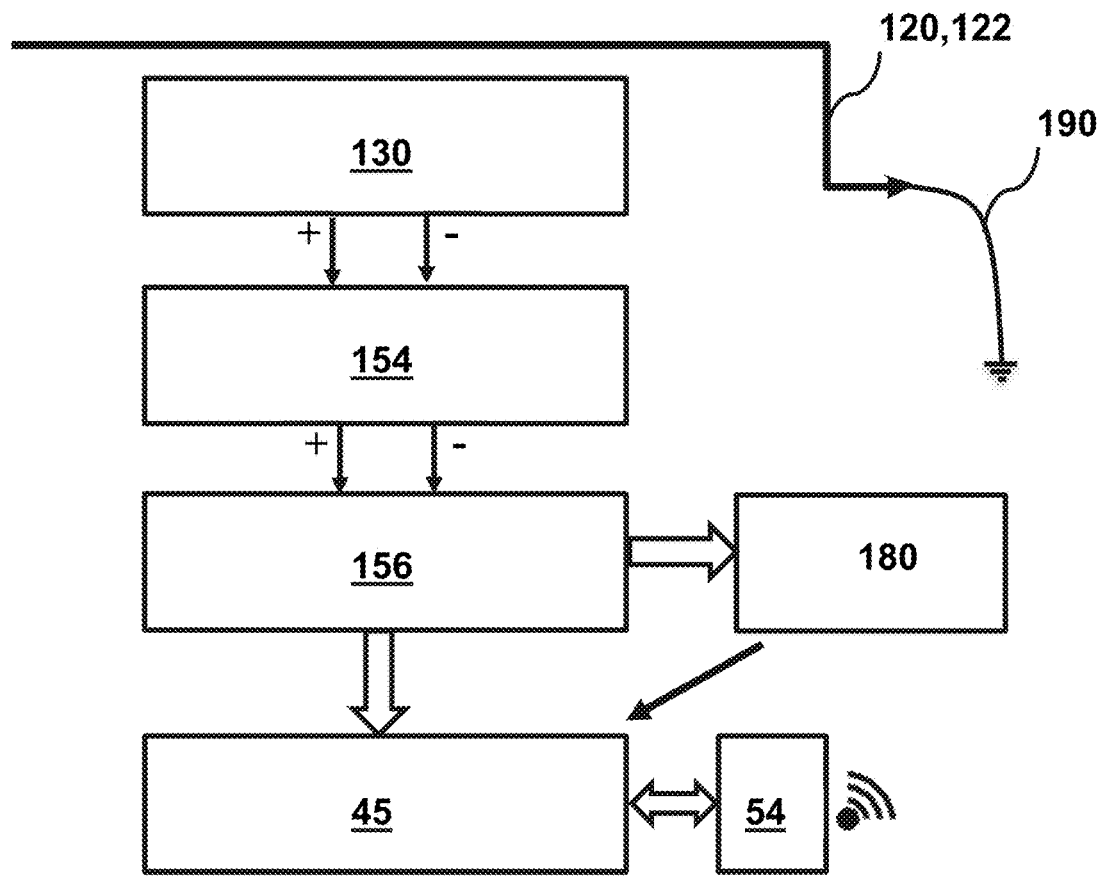
FIG. 10 illustrates a configuration of grounding diagnostics using voltage and/or current and/or electrostatic detector and energy harvesting, according to an example.
Figure 10:
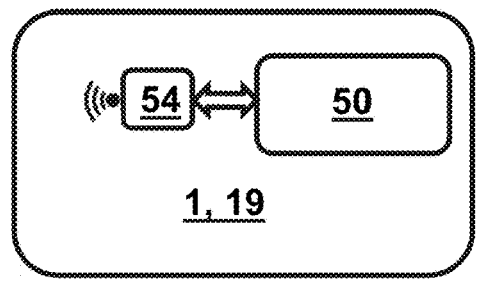

FIG. 10 illustrates a configuration of grounding diagnostics using voltage and energy harvesting.

The configuration is similar to the configuration disclosed in FIG. 9. However, instead of using the energy to make a light emitter blink, the energy is stored and used for other purposes.

A voltage detector 130 may be in connection with a grounding path of the charge collecting structure connected to the ground, or the voltage detector 130 may be able to wireless detect the voltage.

The voltage detector 130 can be a modified version of the detector called VKP-FF-35.

The voltage detector 130 is connected to a power management circuit 154.

The power management circuit 154 is connected to energy storage 156.

The energy storage 156 may power other power consuming installations 180 such as a System-on-a-Chip (SoC) which may contain one or more core capabilities such as software, processor/microprocessor, networking, memory, data storage, processing etc. Alternatively any combination of processing unit (microcontroller, microprocessor or any similar units) may be used for the installation. The energy storage 156 may power other electrical power consuming installations 180 located in the rotor, like for example any electrical consuming electronics or motors, such as for example blade pitch motors or blade de-icing systems.

The energy storage 156 is connected to a sensor node 45 in wired or wireless communication with a collection cabinet 50 having a communication module 54. The collection cabinet 50 may be positioned in the structure 1 or nacelle 19.

Figure 11:
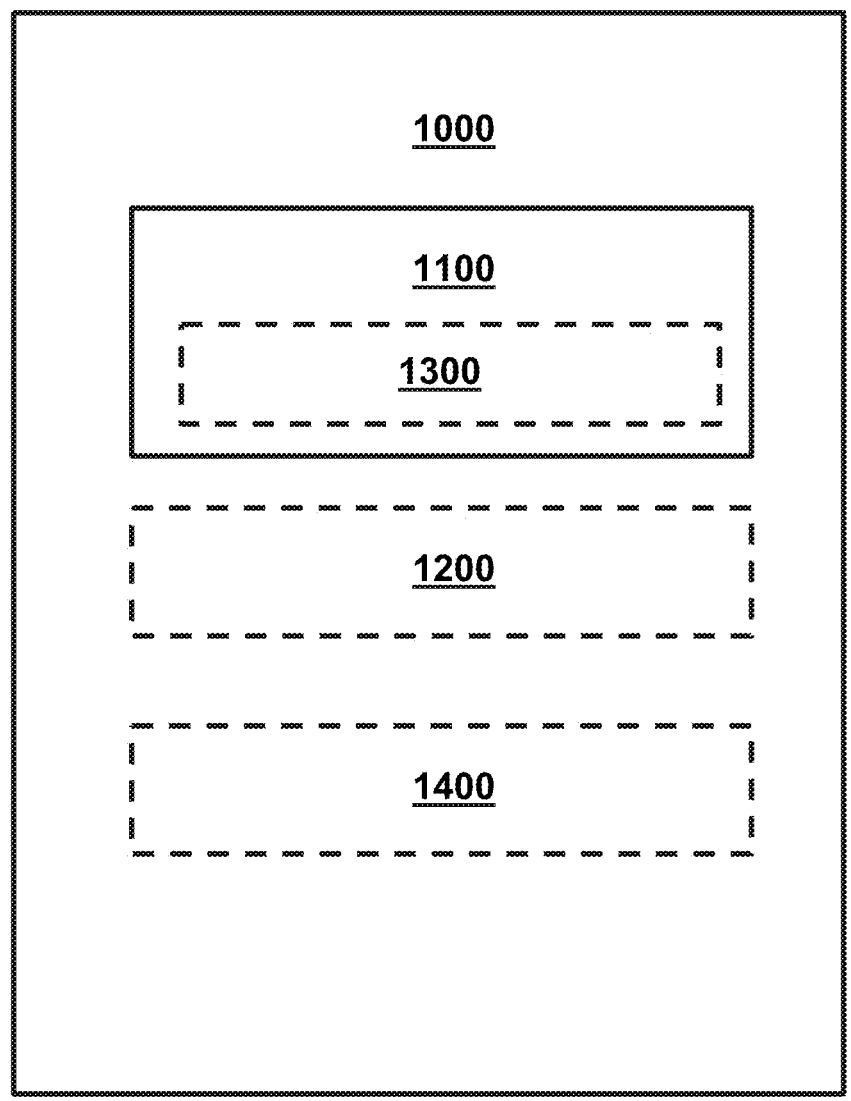
FIG. 11 illustrates a method of diagnosing a grounding system of a structure, according to an example.

FIG. 11 illustrates a method of diagnosing 1000 a grounding system 100 of a structure 1.

The method of diagnosing 1000 a grounding system 100 of a structure 1 comprises a charge collecting structure 120 conductively connected to the ground 190 via a grounding path 122. The diagnosing 1000 involves an act of monitoring 1100 an output 142 of an electrostatic motor 140 connected to the grounding path 122.

The output 142 of the electrostatic motor 140 is a function of collected charge conducted to the ground 190; and wherein the output 142 is a function of relative measures performed and chosen amongst:

a measure of rotational speed of the electrostatic motor;
a measure of torque of the electrostatic motor;
or combinations thereof;
and relative to a respective calibrated measure performed.

The grounding system 100 may be a lightning protection system 102 and the structure 1 comprises parts of a WTG 12.

Optionally, the method 1000 comprises a further act of generating 1200 power by generator means 150 driven by the electrostatic motor 140. This can performed as disclosed in FIG. 7.

Thereby, the act of monitoring 1100 is powered by the power generated by the generator means 150.

Optionally, the structure 1 comprises a blade 22 and wherein the act of monitoring 1100 further comprises acts of:

detecting 1300 a lightning strike 192;
detecting 1300 electrostatic discharge 194;
or combinations thereof.

Detection 1300 may also include detecting unstable, missing, or no electrostatic discharge, which is the case when the grounding system is partly or fully disconnected.

In another embodiment of diagnosing 1000, a grounding system 100 is of a structure 1 comprising a charge collecting structure 120 conductively connected to the ground 190 via a grounding path 122.

Wherein diagnosing 1000 involves an act of monitoring 1100 output 142I, 142II of a voltage detector 130I, 130II connected to the grounding path 122.

The diagnosing 1000 may involve an act of comparing 1400 outputs 142I, 142II of at least two voltage detectors 130I, 130II connected at two different points 124I, 124II of the grounding path.

In a further embodiment, the method of diagnosing 1000 is performed as a function of both of the previously described embodiments of the method of diagnosing 1000.

Figure 12:
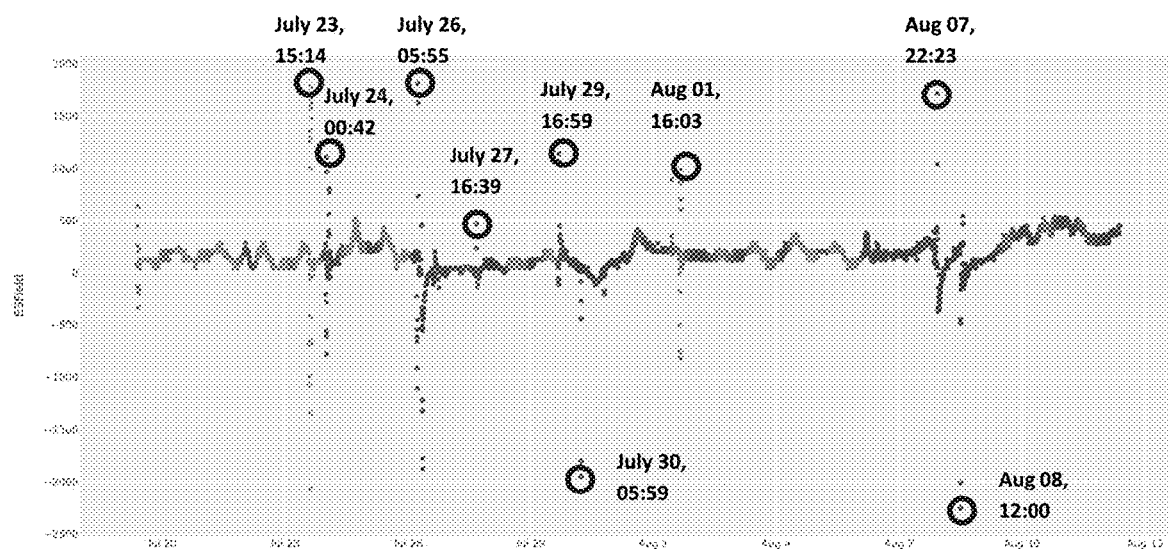
FIG. 12 illustrates sensory data measured by an electrostatic sensor installed on a wind turbine generator in Gols, Austria measured over the course of a month, according to an example.

FIG. 12 illustrates sensory data measured by an electrostatic sensor installed on a wind turbine generator in Gols, Austria, measured over the course of a month. The electrostatic sensor was installed in one of the blades as shown in FIG. 2 and the electrostatic sensor could be any of the sensors with reference number 45 as it not required to have the electrostatic sensor installed in one of the blades, however it is preferred to have the electrostatic sensor installed in the blade.

The sensory data is presented in the shown graph. The graph has time along the first axis and electrostatic field (ESField) along the second axis. The first axis show that the sensory data is measured over a period of roughly a month. The unit of the Electrostatic field is V. The graph shows eight large spikes where both a large positive and negative value is observed. In seven of these cases rain was observed shortly after the spikes; thus, it is possible to predict rain by measuring the electrostatic field.

FIGS. 13-17 illustrates part of sensory data shown in FIG. 12 compared with precipitation measured by a local weather station. In each figure, the data shown is for one day. FIGS. 13A-17A show the sensory data in FIG. 12 but for a single day. FIGS. 13B-17B show the temperature 800 and the dew point 802 measured at the weather station. FIGS. 13C-17C disclose measured precipitation rate 804 and precipitation accumulated 806 and the figures disclose the atmospheric pressure in hPa.

Figure 13:
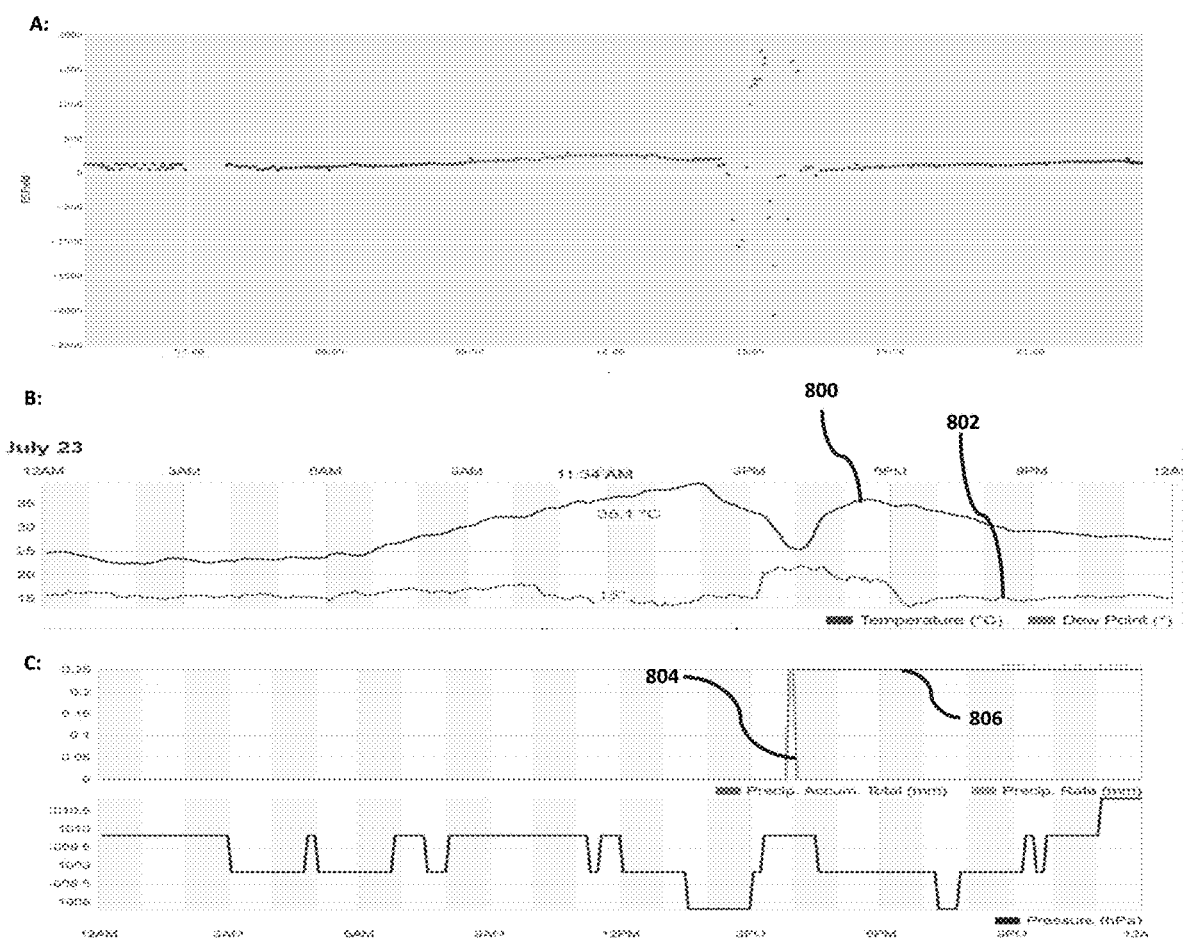
FIG. 13 illustrates part of sensory data shown in FIG. 12 compared with precipitation measured by a local weather station, according to an example.
Figure 14:
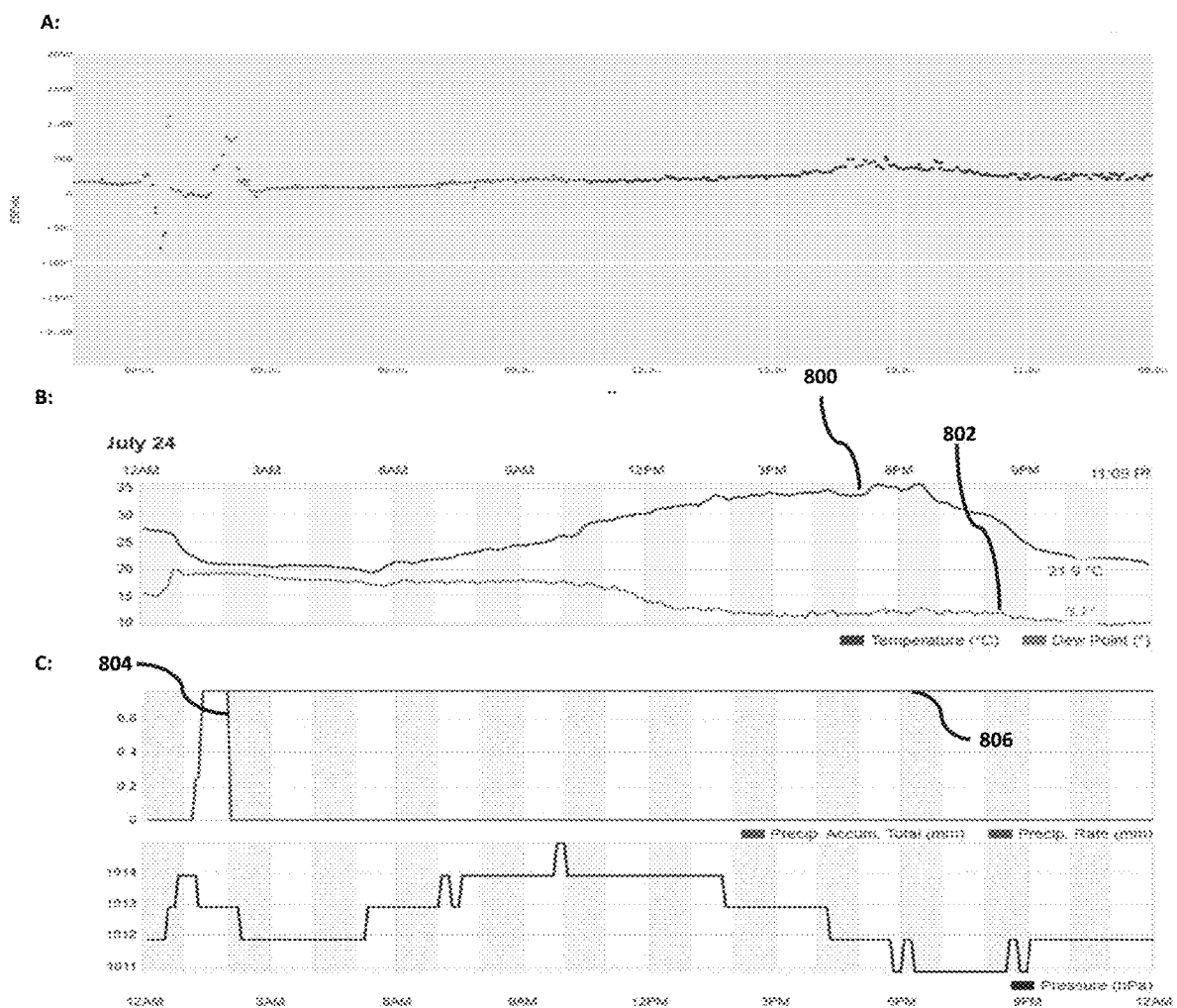
FIG. 14 illustrates part of sensory data shown in FIG. 12 compared with precipitation measured by a local weather station, according to an example.
Figure 15:
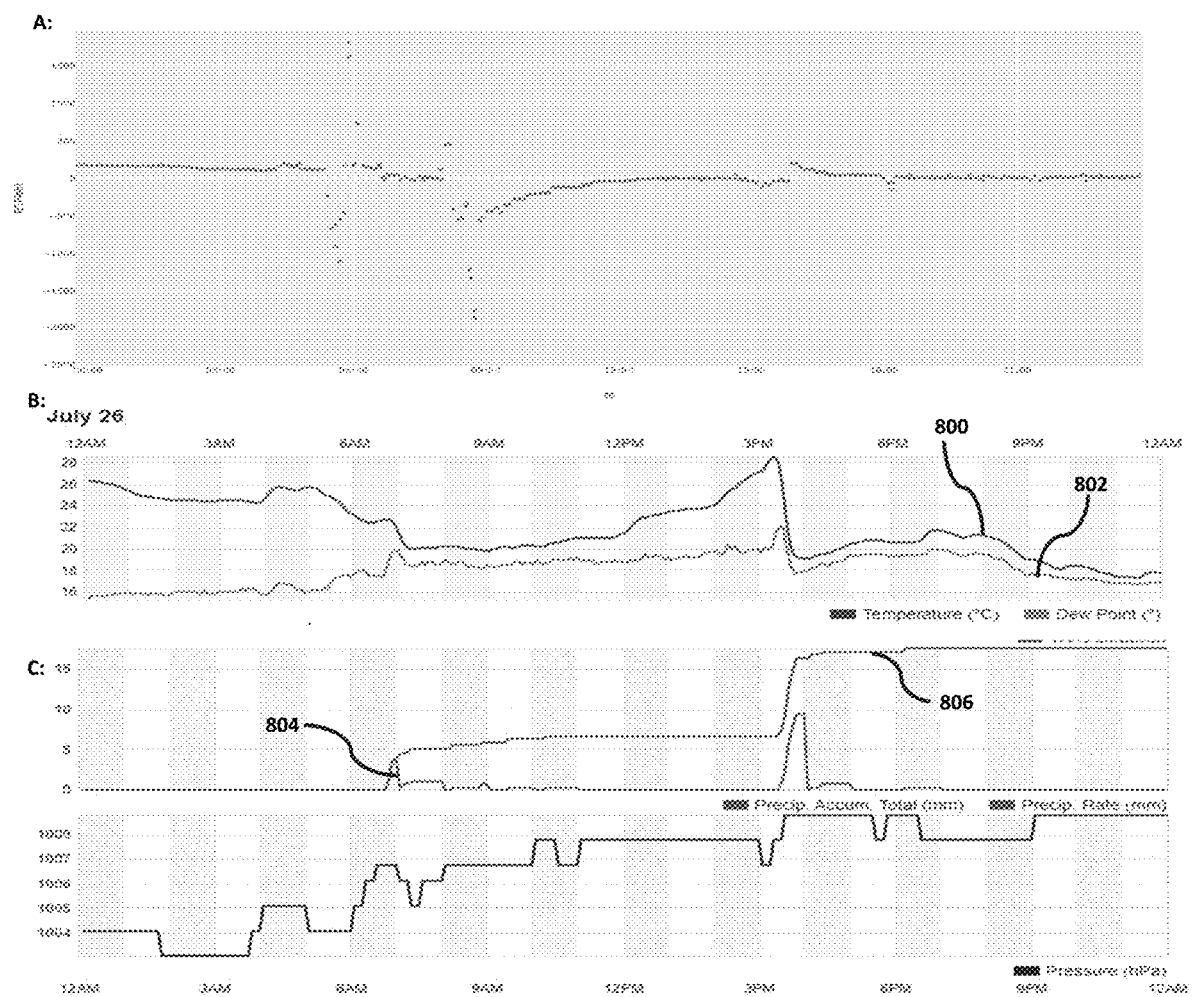
FIG. 15 illustrates part of sensory data shown in FIG. 12 compared with precipitation measured by a local weather station, according to an example.
Figure 16:
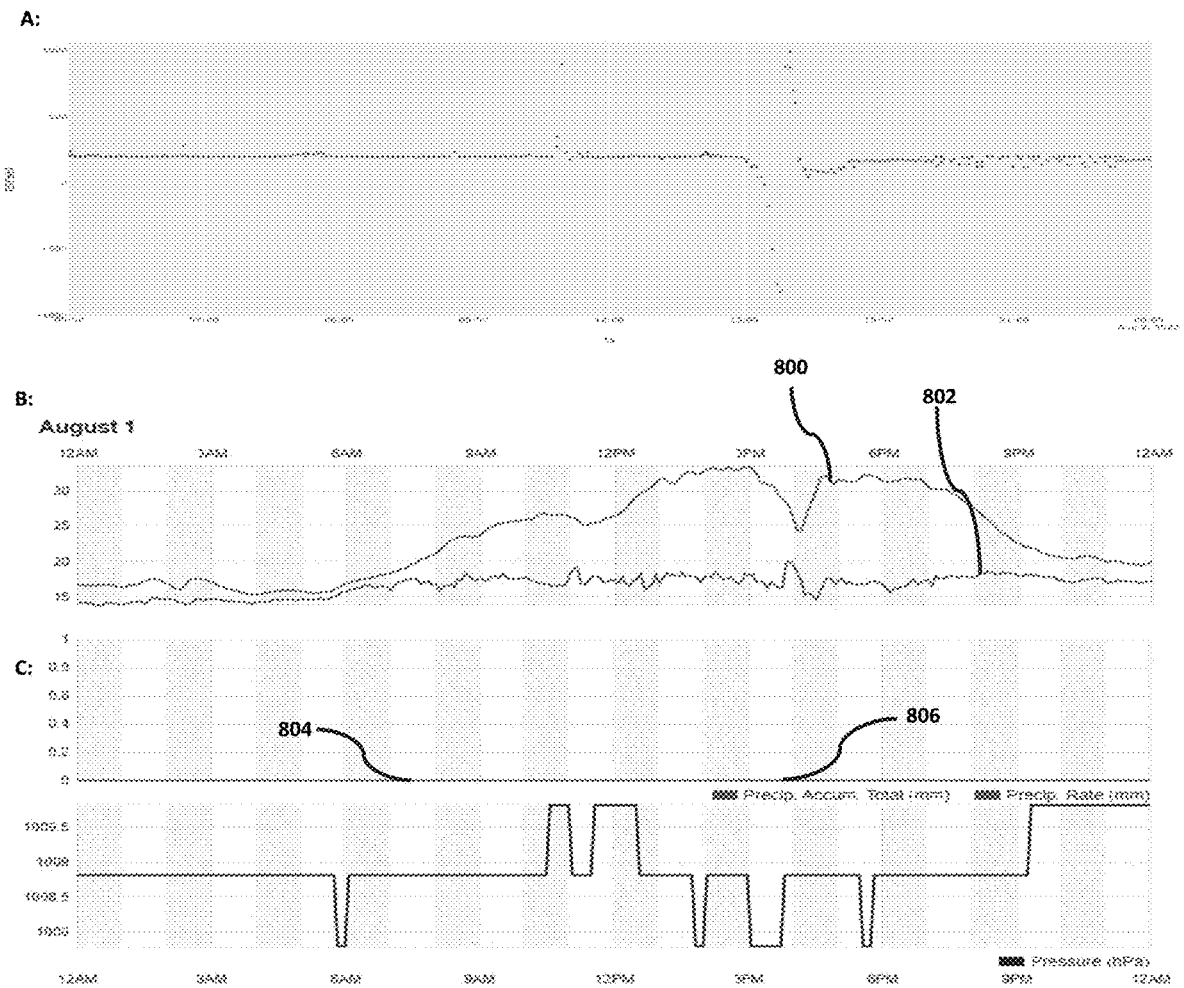
FIG. 16 illustrates part of sensory data shown in FIG. 12 compared with precipitation measured by a local weather station, according to an example.
Figure 17:
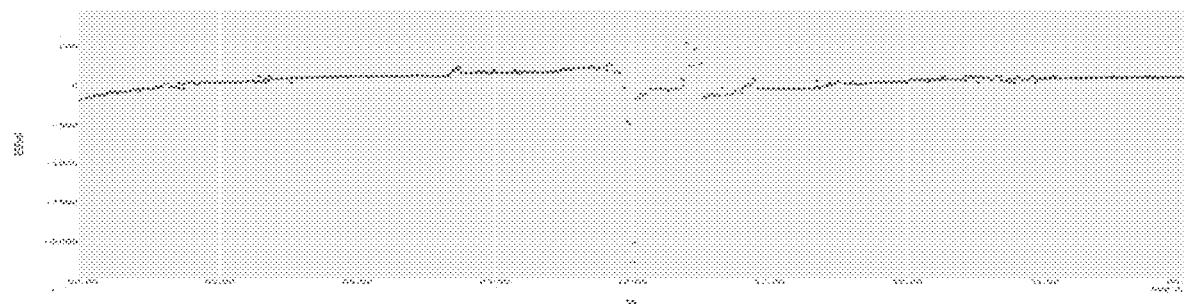
FIG. 17 illustrates part of sensory data shown in FIG. 12 compared with precipitation measured by a local weather station, according to an example.
Figure 17:
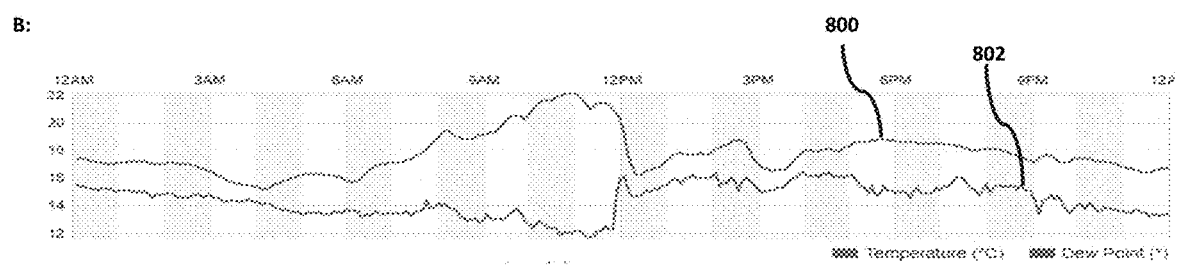
Figure 17:
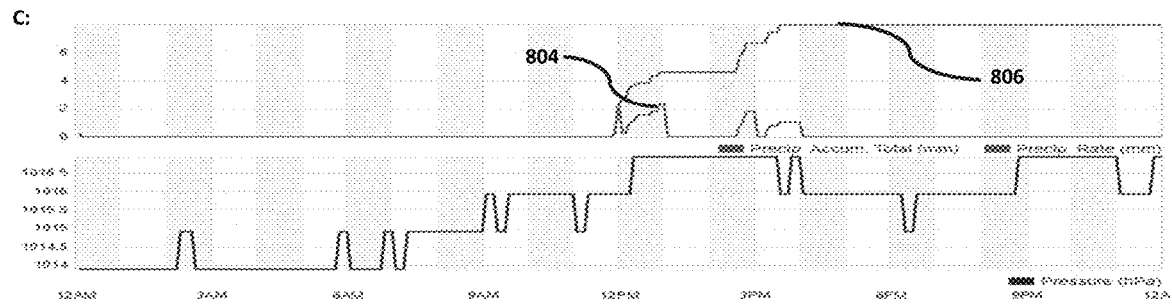

FIG. 13 show data for July 23. FIG. 14 show data for July 24. FIG. 15 show data for July 26. FIG. 16 show data measured on the 1 August, wherein no precipitation was observed. FIG. 17 show data measured on the 8 August.

The invention claimed is:

1. A structure adapted for monitoring electric charge characteristics of the structure, wherein the wind turbine generator comprises an electric charge monitoring system comprising one or more electrostatic sensors adapted for measuring polarity, the one or more electrostatic sensors being configured for measuring an electrostatic potential of one or more parts or at locations of the structure, wherein sensory data from the electrostatic sensors are time-stamped and time-synchronised, and the electric charge monitoring system is configured for monitoring charge characteristics at the one or more parts or locations of the structure.

2. The structure according to claim 1, wherein the electric charge monitoring system is further configured for predicting rain as a function of the sensory data and optionally sending an alert as a function of predicted rain.

3. The structure according to claim 1, wherein one or more of the one or more electrostatic sensors are chosen amongst a surface potential sensor; and/or
a non-contact vibration capacitance electrostatic sensor.

4. The structure according to claim 1, wherein the structure is chosen amongst;

a wind turbine generator (WTG) comprising one or more wind turbine blades; or
a pylon; or
a high-rise building; or
a bridge; or
a dam.

5. The structure according to claim 1, wherein the structure is a wind turbine generator (WTG) comprising one or more wind turbine blades, wherein at least two of the wind turbine blades comprises one or more of the electrostatic sensors and the electric charge monitoring system is configured for comparing charge characteristics of the two or more wind turbine blades.

6. The structure according to claim 1, wherein the structure is a wind turbine generator wherein the structure is a wind turbine generator (WTG) comprising one or more wind turbine blades, wherein at least one of the wind turbine blades comprises one or more of the electrostatic sensors and the electric charge monitoring system is configured to estimate leading edge erosion on the one or more wind turbine blades as a function of charge characteristics and comparing sensory data of the at least one electrostatic sensor with historical sensory data.

7. The structure according to claim 1, wherein the structure is a wind turbine generator (WTG) comprising one or more wind turbine blades, wherein at least one of the wind turbine blades comprises one or more of the electrostatic sensors and the electric charge monitoring system is configured to predicting rain or hail or heavy rain or sandstorms or snow as a function of the charge characteristics of the wind turbine generator.

8. The structure according to claim 1, wherein the structure is a wind turbine generator wherein the structure is a wind turbine generator (WTG) comprising one or more wind turbine blades, wherein at least one of the wind turbine blades comprises one or more of the electrostatic sensors and the electric charge monitoring system is configured to detect icing on the one or more wind turbine blades as a function of charge characteristics by comparing sensory data of the at least one electrostatic sensor with historical sensory data.

9. The structure according to claim 1, wherein the wind turbine generator further comprises a temperature sensor, and/or humidity sensor, and/or an air pressure sensor, and/or a wind speed sensor, and the monitoring of charge characteristics is performed as a function of the temperature, and/or the humidity, and/or pressure, and/or wind speed.

10. The structure according to claim 1, wherein the wind turbine generator comprises a grounding system comprising a charge collecting structure conductively connected to the ground via a grounding path, wherein the electric charge monitoring system is further configured for diagnosing the grounding system as a function of the electrostatic potential of the one or more parts or location of the structure.

11. The structure according to claim 1, wherein the electric charge monitoring system is further configured for monitoring risk of a lightning strike.

12. The structure according to claim 11, wherein the electric charge monitoring system is further configured to characterise lightning strikes as a function of the electrostatic potential of the one or more parts of the structure or at the locations of the structure before, during and after a lightning strike.

13. The structure according to claim 1, wherein the one or more electrostatic sensors include electrostatic sensors positioned external to the structure for measuring electrostatic potential of the structure.

14. The structure according to claim 1, wherein the structure is a wind turbine generator comprising one or more wind turbine blades, and wherein the electric charge monitoring system is enabled to control the blade pitch angle of the one or more wind turbine blades, and
the electric charge monitoring system is adapted to optimize the aero dynamic efficiency by changing blade pitch angle.

15. The structure according to claim 1, wherein the electric charge monitoring system comprises a communication module for communication with an external server.

16. A fleet monitoring server comprising
a server communication module being in communication with a plurality of structures according to claim 1,
a storage for storing sensory data from the sensors of the plurality of structure; and
a computation unit configured for comparing sensory data from the plurality of structure and identifying one or more outliers of the structure as a function of the sensory data.

17. The fleet monitoring server according to claim 16, wherein the storage is further configured for storing humidity, temperature, wake, wind speed, and/or pressure.

18. The fleet monitoring server according to claim 16, wherein the fleet monitoring server is configured for sending alarms as a function of outliers.

19. A method of monitoring charge characteristics of a wind turbine generator comprising one or more wind turbine blades with one or more electrostatic sensors having a voltage detection range including positive potential and negative potential, the method comprising steps of
measuring sensory data of the one or more electrostatic sensors;
timestamping and time-synchronising the sensory data;
storing the sensory data;
monitoring charge characteristics of the wind turbine generator; and
sending an alarm as a function of the charge characteristics.

20. The method of monitoring according to claim 19, wherein the method includes a step of
detecting a lightning strike and/or electrostatic discharge.

21. The method of monitoring according to claim 19, wherein the one or more wind turbine blades comprises one or more of the electrostatic sensors, wherein the method comprises a step of
estimating a surface roughness of the one or more wind turbine blades as a function of the charge generation.

22. The method of monitoring according to claim 19, wherein the step of monitoring includes a step of predicting rain and/or hail as a function measured polarity at the one or more electrostatic sensors.

* * * * *